US007060415B2

(12) United States Patent
Kitson et al.

(10) Patent No.: US 7,060,415 B2
(45) Date of Patent: *Jun. 13, 2006

(54) PRINTING PLATE PRECURSOR COMPRISING SOLVENT-RESISTANT COPOLYMER

(75) Inventors: Anthony P. Kitson, Evans, CO (US); Kevin B. Ray, Fort Collins, CO (US); Joanne Ray, Fort Collins, CO (US); Mathias Jarek, Northeim (DE); Celin Savariar-Hauck, Badenhausen (DE)

(73) Assignee: Kodak Polychrome Graphics LLC, Burnaby (CA)

( * ) Notice: Subject to any disclaimer, the term of this patent is extended or adjusted under 35 U.S.C. 154(b) by 0 days.

This patent is subject to a terminal disclaimer.

(21) Appl. No.: 11/130,797

(22) Filed: May 17, 2005

(65) Prior Publication Data

US 2005/0244749 A1 Nov. 3, 2005

Related U.S. Application Data

(63) Continuation-in-part of application No. 10/681,701, filed on Oct. 8, 2003, now Pat. No. 6,893,783.

(51) Int. Cl.
*G03F 7/039* (2006.01)
*G03F 7/11* (2006.01)
*G03F 7/14* (2006.01)
*G03F 7/30* (2006.01)

(52) U.S. Cl. .................... 430/271.1; 430/15; 430/302; 430/309; 430/910; 430/964

(58) Field of Classification Search ............ 430/271.1, 430/964, 910, 309, 15, 302
See application file for complete search history.

(56) References Cited

U.S. PATENT DOCUMENTS

| | | | | |
|---|---|---|---|---|
| 6,143,464 | A | 11/2000 | Kawauchi | |
| 6,294,311 | B1 | 9/2001 | Shimazu et al. | |
| 6,352,811 | B1 | 3/2002 | Patel et al. | |
| 6,352,812 | B1 | 3/2002 | Shimazu et al. | |
| 6,358,669 | B1 | 3/2002 | Savariar-Hauck et al. | |
| 6,475,692 | B1 | 11/2002 | Jarek et al. | |
| 6,475,698 | B1 | 11/2002 | Monk et al. | |
| 6,525,152 | B1 | 2/2003 | Jarek | |
| 6,528,228 | B1 * | 3/2003 | Hauck et al. | 430/166 |
| 6,555,291 | B1 * | 4/2003 | Hauck | 430/302 |
| 6,593,055 | B1 * | 7/2003 | Shimazu et al. | 430/166 |
| 6,645,689 | B1 * | 11/2003 | Jarek | 430/168 |
| 6,858,359 | B1 | 2/2005 | Kitson et al. | |
| 6,893,783 | B1 * | 5/2005 | Kitson et al. | 430/15 |
| 2005/0037292 | A1 * | 2/2005 | Kitson et al. | 430/348 |

FOREIGN PATENT DOCUMENTS

| | | | |
|---|---|---|---|
| EP | 0908307 | A2 | 4/1999 |
| EP | 0908784 | A1 | 4/1999 |
| EP | 0984622 | A2 | 3/2000 |
| EP | 1023994 | A1 | 8/2000 |
| EP | 0864420 | B1 | 5/2001 |
| EP | 0908305 | B1 | 11/2001 |
| EP | 0950518 | B1 | 1/2002 |
| EP | 0940266 | B1 | 6/2002 |
| EP | 0960728 | B1 | 5/2003 |

OTHER PUBLICATIONS

JP 11-119419 (Abstract) Apr. 30, 1999.
JP 2000-330265 (Abstract) Nov. 30, 2000.
JP 2001-042509 (Abstract) Feb. 16, 2001.
JP 2001-042510 (Abstract) Feb. 16, 2001.

* cited by examiner

*Primary Examiner*—Richard L. Schilling
(74) *Attorney, Agent, or Firm*—J. Lanny Tucker

(57) ABSTRACT

The present invention provides a positive-working, thermally imageable element generally comprising a multi-layered imageable coating. The invention provides an imageable element comprising a substrate, an ink-receptive top layer, and an underlayer, the underlayer including a specific copolymer described herein. The copolymer can be a polymer comprising constitutional units derived from: a) a monomer having a cyclic urea group; b) a monomer comprising an N-substituted maleimide; c) a (meth)acrylamide or (meth)acrylate monomer; and d) a (meth)acrylic acid or vinyl benzoic acid monomer. In another embodiment, the copolymer can be a polymer comprising constitutional units derived from: a) a monomer having a cyclic urea group; b) a (meth)acrylic acid or vinyl benzoic acid monomer; c) and a (meth)acrylonitrile monomer. The imageable element may be used to prepare a lithographic printing plate that is resistant to press chemistry and can optionally be baked to increase press runlength.

19 Claims, No Drawings

PRINTING PLATE PRECURSOR COMPRISING SOLVENT-RESISTANT COPOLYMER

REFERENCE TO RELATED APPLICATION

This application is a continuation-in-part of U.S. patent application Ser. No. 10/681,701 filed Oct. 8, 2003 (now U.S. Pat. No. 6,893,783, issued May 17, 2005), and entitled "Multilayer Imageable Elements," the disclosure of which is hereby incorporated by reference in its entirety.

TECHNICAL FIELD

The present invention relates to lithographic printing. In particular, this invention relates to multi-layer, positive-working, thermally imageable elements that can be used to prepare lithographic printing plates.

Imageable elements useful as lithographic printing plate precursors typically comprise an imageable layer applied over the hydrophilic surface of a substrate. The imageable layer includes one or more radiation-sensitive components. Following imaging, either imaged regions or unimaged regions of the imageable layer are removed by a suitable developer, revealing the underlying hydrophilic surface of the substrate. If the imaged regions are removed, the precursor is positive-working. Conversely, if the unimaged regions are removed, the precursor is negative-working.

In each instance, the regions of the imageable layer that remain (i.e., the image areas) are ink-receptive, and the regions of the hydrophilic surface revealed by the developing process accept water. When the surface is moistened with water and ink is applied, the hydrophilic regions retain the water and repel the ink, and the ink-receptive regions accept the ink and repel the water.

During printing, the ink is ultimately transferred to the surface of a medium upon which the image is to be reproduced. Typically, the ink is first transferred to an intermediate blanket, which in turn transfers the ink to the surface of the medium.

Conventional imaging of the imageable element with ultraviolet and/or visible radiation typically requires the use of a mask, which has transparent and opaque regions. Regions of the imageable layer under the transparent regions of the mask are exposed to imaging radiation, but regions of the imageable layer under the opaque regions of the mask are not exposed.

Direct digital imaging, which obviates the need for imaging through a mask, is becoming increasingly important in the printing industry. Imageable elements for the preparation of lithographic printing plates have been developed for use with infrared lasers, for example.

Thermally imageable, multi-layer elements are reported, for example, in U.S. Pat. No. 6,294,311 to Shimazu, et al., U.S. Pat. No. 6,352,812 to Shimazu, et al., and U.S. Pat. No. 6,593,055 to Shimazu, et al.; U.S. Pat. No. 6,352,811 to Patel, et al.; U.S. Pat. Nos. 6,358,669 and 6,528,228 to Savariar-Hauck, et al.; U.S. Pat. No. 6,858,359 to Kitson, et al.; and U.S. Pat. No. 6,555,291 to Hauck, the disclosure of each of which is incorporated herein by reference.

Recently offset printing plates have been the subject of increasing performance demands with respect to resistance to solvents and common printing room chemicals. Printing plates encounter press room chemicals such as plate cleaning agents, blanket washing agents, and alcohol substitutes in the fountain solution. Particularly in printing processes using ultraviolet-curable inks, where rinsing agents with a high content of esters, ethers or ketones are used, the chemical resistance of conventional positive-working printing plates is not adequate.

Image areas should be substantially insoluble in ultraviolet-curable inks and substantially insoluble in solvents, often glycol ethers, used to clean plates during or after a print run. Conventional quinone diazide/phenolic resin-based radiation-sensitive compositions are soluble in glycol ether solvents, and are disfavored for printing with ultraviolet-curable inks.

Another demand is that the image areas should be substantially insoluble in the founts (or dampening liquids) which are used to wet the hydrophilic areas of the plates. Conventional founts are largely made up of water and a small amount of alcohol. More recently, such founts have been replaced, in some situations, with formulations comprising alternative additives in order to remove inflammable alcohol solvents from press room environments. Additives that have been used include surfactants and other non-volatile solvents which can be more aggressive towards the radiation-sensitive compositions. Conventional radiation-sensitive compositions are relatively susceptible to attack by replacement founts.

The properties of radiation-sensitive compositions can be improved, in part, by way of specially adapted polymers. For example, U.S. Pat. No. 6,475,692 to Jarek, et al. describes radiation-sensitive compositions which significantly increase the chemical resistance of printed circuit boards for integrated circuits, photomasks and in particular printing forms. However, the compositions reported in U.S. Pat. No. 6,475,692 are not bakeable, which means they do not harden upon heating. U.S. Pat. No. 6,475,698 to Monk, et al. describes a solvent-resistant polymer comprising recurring units derived from a substituted cyclic imide. U.S. Pat. No. 6,645,689 to Jarek describes a solvent-resistant polymer comprising recurring units derived from a cyclic urea.

A need remains for positive-working, thermally imageable elements that are bakeable and have improved resistant to press chemistries, such as inks, fountain solution, and the solvents used in washes, such as UV washes. Bakeability is highly desirable because baking increases the press runlength for positive working thermally imageable elements.

SUMMARY OF THE INVENTION

In one embodiment, the present invention provides a positive-working, thermally imageable element. The imageable element generally comprises a multi-layered imageable coating. The imageable element may be used, for example, to prepare a lithographic printing plate that is resistant to typical press solutions or chemistries and can optionally be baked to increase press runlength. The imageable element may be especially useful for preparing a printing plate that can be employed in printing processes using ultraviolet-curable inks, in which aggressive washes that contain organic solvents (such as esters, ethers, or ketones) are used.

More specifically, the invention provides an imageable element comprising a substrate having a hydrophilic surface, a photothermal conversion material, an ink-receptive top layer, and an underlayer between the hydrophilic surface and the top layer, the underlayer including a copolymer described herein. The top layer is substantially free of the photothermal conversion material, and the top layer is not removable by contact with a developer solution prior to imaging of the element. After imaging of the element, the top layer and the underlayer are both removable by contact with the developer solution.

The invention further provides a method for use in the production of an imageable element. The method includes the steps of: providing a substrate having a hydrophilic surface; and coating an underlayer onto the hydrophilic surface, the underlayer including a copolymer as described herein; and coating one or more additional layers over the underlayer, to provide an imageable coating.

DETAILED DESCRIPTION OF THE INVENTION

In one embodiment, the present invention provides a positive-working, thermally imageable element. The imageable element generally comprises a multi-layered imageable coating. More specifically, the invention provides an imageable element comprising a substrate having a hydrophilic surface, a photothermal conversion material, an ink-receptive top layer, wherein the top layer is substantially free of the photothermal conversion material, and wherein the top layer is not removable by contact with a developer solution prior to imaging of the element, and an underlayer between the hydrophilic surface and the top layer, the underlayer including a copolymer described herein, wherein after imaging of the element the top layer and the underlayer are both removable by contact with the developer solution.

In one embodiment of the imageable element, the underlayer includes a copolymer comprising in polymerized form: a) constitutional units derivable from a monomer having a cyclic urea group, the monomer represented by

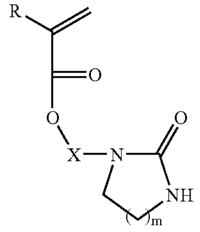

in which R is hydrogen or methyl, X is ($C_2$–$C_{12}$) alkyl, and m is 1 to 3; b) constitutional units derivable from N-phenylmaleimide, N-cyclohexylmaleimide, N-benzylmaleimide, N-(p-carboxyphenyl)maleimide, or a combination thereof; c) constitutional units derivable from acrylamide, methacrylamide, N-methoxymethylmethacrylamide, methoxymethyl-methacrylate, or a combination thereof; and d) constitutional units derivable from acrylic acid, methacrylic acid, vinyl benzoic acid, or a combination thereof.

In another embodiment of the imageable element, the underlayer includes a copolymer comprising in polymerized form: a) constitutional units derivable from a monomer having a cyclic urea group, the monomer represented by

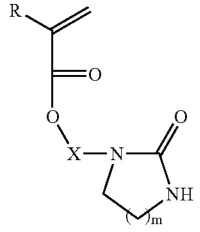

in which R is hydrogen or methyl, X is ($C_2$–$C_{12}$) alkyl, and m is 1 to 3; b) constitutional units derivable from acrylic acid, methacrylic acid, vinyl benzoic acid, or a combination thereof; and c) constitutional units derivable from acrylonitrile, methacrylonitrile, or a combination thereof. The copolymer may further comprise constitutional units derivable from N-phenyl-maleimide, N-cyclohexylmaleimide, N-benzylmaleimide, N-(p-carboxyphenyl)maleimide, or a combination thereof.

Also within the scope of the invention is the use of a copolymer described herein in at least one layer of an imageable coating on an imageable element.

The invention further provides a method for use in the production of an imageable element. The method includes the steps of: providing a substrate having a hydrophilic surface; and coating an underlayer onto the hydrophilic surface, the underlayer including a copolymer as described herein; and coating one or more additional layers over the underlayer, to provide an imageable coating.

Unless the context indicates otherwise, in the specification and claims, the terms photothermal conversion material, copolymer, binder, monomer, and similar terms also include mixtures and combinations of such materials. Unless otherwise specified, all percentages are percentages by weight. Thermal imaging refers to imaging with a hot body, such as a thermal head, or with infrared radiation.

For clarification of definitions for any terms relating to polymers, please refer to "Glossary of Basic Terms in Polymer Science" as published by the International Union of Pure and Applied Chemistry ("IUPAC"), *Pure Appl. Chem.* 68, 2287–2311(1996). However, any definitions explicitly set forth herein should be regarded as controlling.

Unless otherwise defined, the term "alkyl" in this application is intended to signify straight-chain or branched saturated hydrocarbon or hydrocarbyl groups with 1 to 12 carbon atoms, commonly 1 to 4 carbon atoms; an alkyl group may be substituted with common substituents such as halogen atoms. The term "aryl" signifies an aromatic hydrocarbon or heterocyclic group, such as phenyl, naphthyl, anthryl or an N-substituted carbazole group, the term "aryl" includes unsubstituted aryl groups as well as substituted aryl groups having common substituents such as halogen atoms, alkyl groups, amine groups, hydroxy groups, and nitro groups. The term "alkoxy" comprises alkoxy groups with 1 to 12 carbon atoms; the alkyl portion of the alkoxy group can be branched or unbranched and may optionally contain one or several substituents such as hydroxy, halogen, alkyl groups and aryl groups. The term "halogen" indicates fluorine, chlorine, bromine or iodine.

As used herein, the prefix "(meth)acryl-" with respect to a monomer indicates that the methacryl- and acryl- monomers may be used interchangeably. By way of example only, "(meth)acrylonitrile" indicates that either acrylonitrile or methacrylonitrile, or a combination of acrylonitrile and methacrylonitrile, is suitable for the stated purpose.

Imageable Element

In one embodiment, the invention provides an imageable element. The imageable element generally comprises a multi-layered imageable coating. The imageable element may be useful as precursor for a lithographic printing plate, for example. The imageable element comprises a substrate with a hydrophilic surface, an underlayer, and a top layer. A photothermal conversion material is present, generally either in the underlayer and/or in a separate layer.

More specifically, the invention provides an imageable element comprising a substrate having a hydrophilic surface, a photothermal conversion material, an ink-receptive top layer, wherein the top layer is substantially free of the photothermal conversion material, and wherein the top layer is not removable by contact with a developer solution prior to imaging of the element, and an underlayer between the hydrophilic surface and the top layer, the underlayer including a copolymer described below, wherein after imaging of the element the top layer and the underlayer are both removable by contact with the developer solution.

When the imageable element is used as a printing plate, the top layer provides an ink-receptive surface. The top layer typically comprises an ink-receptive polymeric binder, and a dissolution inhibitor. After imaging, the exposed regions of the top layer are removed more rapidly in a developer than the unexposed regions.

In one embodiment of the imageable element, the underlayer includes a copolymer comprising in polymerized form: a) constitutional units derivable from a monomer having a cyclic urea group, the monomer represented by:

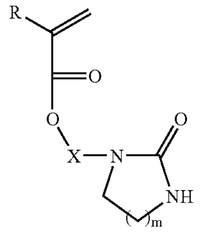

in which R is hydrogen or methyl, X is ($C_2$–$C_{12}$) alkyl, and m is 1 to 3; b) constitutional units derivable from N-phenylmaleimide, N-cyclohexylmaleimide, N-benzylmaleimide, N-(p-carboxyphenyl)maleimide, or a combination thereof; c) constitutional units derivable from acrylamide, methacrylamide, N-methoxymethylmethacrylamide, methoxymethyl-methacrylate, or a combination thereof; and d) constitutional units derivable from acrylic acid, methacrylic acid, vinyl benzoic acid, or a combination thereof.

In another embodiment of the imageable element, the underlayer includes a copolymer comprising in polymerized form: a) constitutional units derivable from a monomer having a cyclic urea group, the monomer represented by

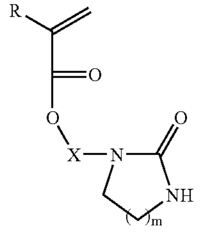

in which R is hydrogen or methyl, X is ($C_2$–$C_{12}$) alkyl, and m is 1 to 3; b) constitutional units derivable from acrylic acid, methacrylic acid, vinyl benzoic acid, or a combination thereof; and c) constitutional units derivable from acrylonitrile, methacrylonitrile, or a combination thereof.

Each of the components of the imageable element are described more fully below.

Substrate

The substrate acts as a support, and may be any material conventionally used for the preparation imageable elements useful as lithographic printing plates. In general, a suitable lithographic substrate will have a hydrophilic surface on which the imageable layer is disposed.

The substrate material should be strong, stable, and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Suitable metal materials include, for example, aluminum, zinc, titanium, and alloys thereof. The back side of the lithographic substrate (i.e., the side opposite the imageable layer) may be coated with an antistatic agent and/or a slipping layer or matte layer to improve handling and "feel" of the imageable element.

Typically, when the substrate material is a polymeric film, it will contain a sub-coating on one or both surfaces to modify the surface characteristics. For example, the polymeric film may be coated to enhance the hydrophilicity of the surface, to improve adhesion to overlying layers, to improve planarity of paper substrates, and the like. The nature of this coating depends upon the substrate and the composition of subsequent layers. Examples of subbing materials are adhesion-promoting materials, such as alkoxysilanes, aminopropyltriethoxysilane, glycidoxypropyltriethoxysilane and epoxy functional polymers, as well as conventional subbing materials used on polyester bases in photographic films.

One particularly suitable lithographic substrate is a hydrophilic aluminum substrate. Generally an aluminum support will be surface-treated by techniques known in the art, including physical graining, electrochemical graining, chemical graining, and anodizing. If the surface is roughened, the average roughness (Ra) is preferably in the range from 0.1 to 0.8 μm, and more preferably in the range from about 0.1 to about 0.4 μm.

Conventional anodization techniques include sulfuric acid anodization and phosphoric acid anodization, for example. Anodic pore size for sulfuric acid anodization is typically less than 20 nm whereas anodic pore size for phosphoric acid anodization is typically greater than 30 nm. The use of large anodic pore substrates that are phosphoric acid anodized is preferred over sulfuric acid-anodized substrates. Other conventional anodization methods can also be used in the preparation of the anodized substrate of the present invention, including particularly those that produce an anodic pore size larger than anodic pore size produced by sulfuric acid anodization.

The substrate should be of sufficient thickness to sustain wear from printing and be thin enough to wrap around a cylinder in a printing press, typically about 100 μm to about 600 μm. An aluminum lithographic substrate may comprise an interlayer between the aluminum support and any overlying layers. The interlayer may be formed by treatment of the aluminum support with, for example, silicate, dextrine, hexafluorosilicic acid, phosphate/fluoride, poly(acrylic acid) (PAA), poly(vinyl phosphonic acid) (PVPA), vinyl phosphonic acid copolymers, or a water-soluble diazo resin.

Imageable Coating

The imageable element of the invention generally comprises a multi-layer imageable coating on the hydrophilic surface of the substrate. In one embodiment, the imageable coating includes a photothermal conversion material, an ink-receptive top layer, wherein the top layer is not removable by contact with a developer solution prior to imaging of the element, and an underlayer between the hydrophilic surface and the top layer, the underlayer including a copolymer described below, wherein after imaging of the element the top layer and the underlayer are both removable by contact with the developer solution.

Photothermal Conversion Material

Imageable elements that are to be imaged with infrared radiation typically comprise an infrared absorber, known as a photothermal conversion material. Photothermal conversion materials absorb radiation, such as infrared radiation, and convert it to heat. Although a photothermal conversion material is not necessary for imaging with a hot body, imageable elements that contain a photothermal conversion material may also be imaged with a hot body, such as a thermal head or an array of thermal heads.

The photothermal conversion material may be any material that can absorb radiation and convert it to heat. Suitable materials include dyes and pigments. Suitable pigments include, for example, carbon black, Heliogen Green, Nigrosine Base, iron (III) oxide, manganese oxide, Prussian Blue, and Paris blue. Because of its low cost and wide absorption bands that allow it to be used with imaging devices having a wide range of peak emission wavelengths, one particularly useful pigment is carbon black. The size of the pigment particles should not be more than the thickness of the layer that contains the pigment. Preferably, the size of the particles will be half the thickness of the layer or less.

To prevent sludging of the developer by insoluble material, photothermal conversion materials that are soluble in the developer may be more suitable. The photothermal conversion material may be a dye with the appropriate solubility and a suitable absorption spectrum. Dyes with a high extinction coefficient in the range of 750 nm to 1200 nm are most suitable.

Examples of suitable dyes include dyes of the following classes: methine, polymethine, arylmethine, cyanine, hemicyanine, streptocyanine, squarylium, pyrylium, oxonol, naphthoquinone, anthraquinone, porphyrin, azo, croconium, triarylamine, thiazolium, indolium, oxazolium, indocyanine, indotricarbocyanine, oxatricarbocyanine, phthalocyanine, thiocyanine, thiatricarbocyanine, merocyanine, cryptocyanine, naphthalocyanine, polyaniline, polypyrrole, polythiophene, chalcogenopyryloarylidene and bis(chalcogenopyrylo)polymethine, oxyindolizine, pyrazoline azo, and oxazine classes.

Absorbing dyes are reported in numerous publications, for example EP 0 823 327 of Nagasaka, et al., U.S. Pat. No. 4,973,572 to DeBoer, U.S. Pat. No. 5,244,771 to Jandrue, et al., U.S. Pat. No. 5,208,135 to Patel, et al., and U.S. Pat. No. 5,401,618 to Chapman, et al. Other examples of useful absorbing dyes include: ADS-830A and ADS-1064 (American Dye Source, Montreal, Canada), EC2117 (FEW, Wolfen, Germany), CYASORB IR 99 and CYASORB IR 165 (Glendale Protective Technology), EPOLITE IV-62B and EPOLITE III-178 (Epoline), SpectraIR 830A and SpectraIR 840A (Spectra Colors).

The amount of photothermal conversion material is generally sufficient to provide an optical density of at least 0.05, and preferably an optical density of from about 0.5 to about 2 to 3 at the imaging wavelength. As is well-known to those skilled in the art, the amount of compound required to produce a particular optical density can be estimated from the thickness of the underlayer and the extinction coefficient of the infrared absorber at the wavelength used for imaging using Beer's law.

In one embodiment of the present invention, the ink-receptive top layer is substantially free of the photothermal conversion material in order to prevent or reduce ablation during imaging with infrared radiation. The photothermal conversion material can be included in the underlayer or in a separate layer, or both. In one embodiment, the underlayer comprises about 0.1 wt.-% to about 25 wt.-% of the photothermal conversion material, based on the weight of the underlayer. Imageable elements in which the underlayer absorbs imaging radiation are reported, for example, in U.S. Pat. No. 6,352,812 to Shimazu, et al., U.S. Pat. No. 6,352,811 to Patel, et al., and U.S. Pat. Nos. 6,358,669 and 6,534,238 to Savariar-Hauck, et al., each incorporated herein by reference.

In another embodiment, the imageable element further comprises a separate layer between the underlayer and top layer, wherein the separate layer includes the photothermal conversion material.

Top Layer

The top layer is not removable by contact with a developer solution prior to imaging of the imageable element. Exposed areas of the top layer become soluble or dispersible in the developer following imaging. In unexposed areas, the top layer protects the underlayer from being removed by the developer.

To prevent ablation during imaging with infrared radiation, the top layer is substantially free of photothermal conversion material. That is, the photothermal conversion material in the top layer, if any, absorbs less than about 10% of the imaging radiation, preferably less than about 3% of the imaging radiation, and the amount of imaging radiation absorbed by the top layer, if any, is not enough to cause ablation of the top layer.

Any suitable top layer used in multi-layer thermally imageable elements may be used in the imageable elements of the invention. Suitable top layers are described, for example, in U.S. Pat. No. 6,294,311 to Shimazu, et al., U.S. Pat. No. 6,352,812 to Shimazu, et al., and U.S. Pat. No. 6,593,055 to Shimazu, et al.; U.S. Pat. No. 6,352,811 to Patel, et al.; U.S. Pat. Nos. 6,358,669 and 6,528,228 to Savariar-Hauck, et al.; U.S. Pat. No. 6,858,359 to Kitson, et al.; and U.S. Pat. No. 6,555,291 to Hauck, the disclosure of each of which is incorporated herein by reference. Suitable top layers are described also in U.S. patent application Ser. No. 10/973,799 filed Oct. 26, 2004 and U.S. patent application Ser. No. 11/005,548 filed Dec. 6, 2004, the disclosure of each of which is incorporated herein by reference.

When the imageable element is used as a printing plate, the top layer provides an ink-receptive surface. The top layer typically comprises an ink-receptive polymeric material, known as the binder, and a dissolution inhibitor. Alternatively, or additionally, the polymeric material comprises polar groups and acts as both the binder and dissolution inhibitor.

In one embodiment, the binder is insoluble in an aqueous solution having a pH of about 7 or greater, and soluble or dispersible in a solvent such as an organic solvent or an aprotic solvent. Upon imaging, the binder becomes selectively permeable to the developer in exposed areas and can be removed by the action of the developer.

In another embodiment, the binder dissolves in an aqueous alkaline developer, but the top layer is insoluble in aqueous alkaline developer prior to imaging due to the presence of the dissolution inhibitor. However, exposed areas of the top layer become soluble in aqueous alkaline developer upon imaging.

Binder

In some embodiments, the binder is insoluble in an aqueous solution having a pH of about 7 or greater, and soluble or dispersible in a solvent such as an organic solvent or an aprotic solvent. Upon imaging, the binder becomes selectively permeable to the developer in exposed areas and can be removed by the action of the developer. For these embodiment, polymeric materials suitable as the binder include acrylic polymers and copolymers; polystyrene; styrene-acrylic copolymers; polyesters, polyamides; polyureas; polyurethanes; nitrocellulosics; epoxy resins; and combinations thereof. Especially suitable are polymers or copolymers of methyl methacrylate or polystyrene.

In other embodiments, the binder dissolves in an aqueous alkaline developer, but the top layer is insoluble in aqueous alkaline developer prior to imaging due to the presence of the dissolution inhibitor. However, exposed areas of the top layer become soluble in aqueous alkaline developer upon imaging. Polymeric materials that are water-insoluble but dissolve in aqueous alkaline developers are used to prevent sludging of the developer. For these embodiments, polymers that contain phenolic hydroxyl groups either on the polymer backbone or on pendant groups are suitable. Phenolic groups impart aqueous alkaline developer solubility to the top layer and are also believed to form a thermally frangible complex with the dissolution inhibitor.

For these embodiments, the polymeric material is suitably a light-stable, water-insoluble, aqueous alkaline developer-soluble, film-forming polymeric material that has a multiplicity of phenolic hydroxyl groups. Novolac resins, resol resins, acrylic resins that contain pendent phenol groups, and polyvinyl phenol resins are especially suitable. Novolac resins are most suitable.

Novolac resins are commercially available and are well-known to those in the art. Novolac resins are typically prepared by the condensation reaction of a phenol, such as phenol, m-cresol, o-cresol, p-cresol, etc, with an aldehyde, such as formaldehyde, paraformaldehyde, acetaldehyde, etc. or ketone, such as acetone, in the presence of an acid catalyst. The weight average molecular weight is typically about 1,000 to 15,000. Typical novolac resins include, for example, phenol-formaldehyde resins, cresol-formaldehyde resins, phenol-cresol-formaldehyde resins, p-t-butylphenol-formaldehyde resins, and pyrogallol-acetone resins. Particularly useful novolac resins are prepared by reacting m-cresol, mixtures of m-cresol and p-cresol, or phenol with formaldehyde using conditions well known to those skilled in the art.

A solvent soluble novolac resin is one that is sufficiently soluble in a coating solvent to produce a coating solution that can be coated to produce a top layer. In some cases, it may be desirable to use a novolac resin with the highest weight-average molecular weight that maintains its solubility in common coating solvents, such as acetone, tetrahydrofuran, and 1-methoxypropan-2-ol. Top layers comprising novolac resins, including for example m-cresol only novolac resins (i.e. those that contain at least about 97 mol-% m-cresol) and m-cresol/p-cresol novolac resins that have up to 10 mol-% of p-cresol, having a weight average molecular weight of about 10,000 up to about 25,000, may be used. Top layers comprising m-cresol/p-cresol novolac resins with at least 10 mol-% p-cresol, having a weight average molecular weight of about 8,000 up to about 25,000, may also be used. In some instances, novolac resins prepared by solvent condensation may be desirable. Top layers comprising these resins are disclosed in U.S. Pat. No. 6,858,359 to Kitson, et al., the disclosure of which is incorporated herein by reference.

Other useful phenolic resins include polyvinyl compounds having phenolic hydroxyl groups. Such compounds include, for example, polyhydroxystyrenes and copolymers containing recurring units of a hydroxystyrene, and polymers and copolymers containing recurring units of substituted hydroxystyrenes.

Dissolution Inhibitor

The top layer typically comprises a dissolution inhibitor, which functions as a solubility-suppressing component for the binder. Dissolution inhibitors generally have polar functional groups that are thought to act as acceptor sites for hydrogen bonding, such as with hydroxyl groups of the binder. Dissolution inhibitors that are soluble in the developer are most suitable.

The dissolution inhibitor may be a compound present in the top layer. Alternatively, or additionally, the polymeric binder may contain solubility-suppressing polar groups that function as the dissolution inhibitor. Useful dissolution inhibitor compounds are reported in U.S. Pat. No. 5,705,308 to West, et al., U.S. Pat. No. 6,060,222 to West, et al., and U.S. Pat. No. 6,130,026 to Bennett, et al., each of which is incorporated herein by reference.

Useful polar groups for dissolution inhibitors include, for example, diazo groups; diazonium groups; keto groups; sulfonic acid ester groups; phosphate ester groups; triarylmethane groups; onium groups, such as sulfonium, iodonium, and phosphonium; groups in which a nitrogen atom is incorporated into a heterocyclic ring; and groups that contain a positively charged atom, especially a positively charged nitrogen atom, typically a quaternized nitrogen atom, i.e., ammonium groups. Compounds that contain a positively charged (i.e., quaternized) nitrogen atom useful as dissolution inhibitors include, for example, tetraalkyl ammonium compounds, and quaternized heterocyclic compounds such as quinolinium compounds, benzothiazolium compounds, pyridinium compounds, and imidazolium compounds.

Compounds containing other polar groups, such as ether, amine, azo, nitro, ferrocenium, sulfoxide, sulfone, and disulfone may also be useful as a dissolution inhibitor. Monomeric or polymeric acetals having recurring acetal or ketal groups, monomeric or polymeric ortho carboxylic acid esters having at least one ortho carboxylic acid ester or amide group, enol ethers, N-acyliminocarbonates, cyclic acetals or ketals, β-ketoesters or β-ketoamides may also be useful as a dissolution inhibitor. Compounds that contain aromatic groups, such as phenyl, substituted phenyl such as p-methylphenyl, and naphthyl, are especially useful.

Compounds that contain a diazo group that are useful as dissolution inhibitor compounds include, for example, monomeric or polymeric compounds that contain a diazobenzoquinone moiety and/or a diazonaphthoquinone moiety (i.e., quinonediazides).

Compounds that contain a positively charged (i.e., quaternized) nitrogen atom useful as dissolution inhibitor compounds include, for example, tetraalkyl ammonium compounds, quinolinium compounds, benzothiazolium compounds, pyridinium compounds, and imidazolium compounds. Representative tetraalkyl ammonium dissolution inhibitor compounds include tetrapropyl ammonium bromide; tetraethyl ammonium bromide; tetrapropyl ammonium chloride; and trimethylalkyl ammonium chlorides and trimethylalkyl ammonium bromides, such as trimethyloctyl ammonium bromide and trimethyldecyl ammonium chloride.

Representative quinolinium dissolution inhibitor compounds include 1-ethyl-2-methyl quinolinium iodide, 1-ethyl-4-methyl quinolinium iodide and cyanine dyes that comprise a quinolinium moiety such as Quinoldine Blue. Representative benzothiazolium compounds include 3-ethyl-2(3H)-benzothiazolylidene)-2-methyl-1-(propenyl) benzothiazolium cationic dyes and 3-ethyl-2-methyl benzothiazolium iodide.

Diazonium salts are useful as dissolution inhibitor compounds and include, for example, substituted and unsubstituted diphenylamine diazonium salts, such as methoxy-substituted diphenylamine diazonium hexafluoroborates.

Representative sulfonic acid esters useful as dissolution inhibitor compounds include ethyl benzene sulfonate, n-hexyl benzene sulfonate, ethyl p-toluene sulfonate, t-butyl p-toluene sulfonate, and phenyl p-toluene sulfonate. Representative phosphate esters include trimethyl phosphate, triethyl phosphate, and tricresyl phosphate. Useful sulfones include those with aromatic groups, such as diphenyl sulfone. Useful amines include those with aromatic groups, such as diphenyl amine and triphenyl amine.

Keto-containing compounds useful as dissolution inhibitor compounds include, for example, aldehydes; ketones, especially aromatic ketones; and carboxylic acid esters. Representative aromatic ketones include xanthone, flavanone, flavone, 2,3-diphenyl-1-indenone, 1'-(2'-acetonaphthonyl)benzoate, α- and β-naphthoflavone, 2,6-diphenyl-4H-pyran-4-one and 2,6-diphenyl-4H-thiopyran-4-one. Representative carboxylic acid esters include ethyl benzoate, n-heptyl benzoate, and phenyl benzoate.

Other readily available dissolution inhibitors are triarylmethane dyes, such as ethyl violet, crystal violet, malachite green, brilliant green, Victoria blue B, Victoria blue R, Victoria blue BO, BASONYL Violet 610, and D11 (PCAS, Longjumeau, France). These dyes can also act as contrast dyes, which distinguish the unimaged regions from the imaged regions in the developed imageable element.

When a dissolution inhibitor compound is present in the top layer, it typically comprises at least about 0.1 wt.-%, more suitably about 0.5 wt.-% to about 30 wt.-%, and most suitably about 1 wt.-% to 15 wt.-%, based on the dry weight of the layer.

Alternatively, or additionally, the polymeric binder in the top layer can comprise polar groups that act as acceptor sites for hydrogen bonding with the hydroxy groups present in the polymeric material and, thus, act as both the binder and dissolution inhibitor. These derivatized polymeric materials can be used alone in the top layer, or they can be combined with other polymeric materials and/or solubility-suppressing components. The level of derivatization should be high enough that the polymeric material acts as a dissolution inhibitor, but not so high that, following thermal imaging, the polymeric material is not soluble in the developer. Although the degree of derivatization required will depend on the nature of the polymeric material and the nature of the moiety containing the polar groups introduced into the polymeric material, typically about 0.5 mol-% to about 5 mol-%, preferably about 1 mol-% to about 3 mol-%, of the hydroxyl groups will be derivatized.

One group of polymeric materials that comprise polar groups and function as dissolution inhibitors are derivatized phenolic polymeric materials in which a portion of the phenolic hydroxyl groups have been converted to sulfonic acid esters, preferably phenyl sulfonates or p-toluene sulfonates. Derivatization can be carried out by reaction of the polymeric material with, for example, a sulfonyl chloride such as p-toluene sulfonyl chloride in the presence of a base such as a tertiary amine. A useful material is a novolac resin in which about 1 mol-% to 3 mol-%, preferably about 1.5 mol-% to about 2.5 mol-%, of the hydroxyl groups have been converted to phenyl sulfonate or p-toluene sulfonate (tosyl) groups.

Another group of polymeric materials that comprise polar groups and function as dissolution inhibitors are derivatized phenolic resins that contain the diazonaphthoquinone moiety. Polymeric diazonaphthoquinone compounds include derivatized resins formed by the reaction of a reactive derivative that contains diazonaphthoquinone moiety and a polymeric material that contains a suitable reactive group, such as a hydroxyl or amino group.

Suitable polymeric materials for forming these derivatized resins include the novolac resins, resole resins, polyvinyl phenols, acrylate and methacrylate copolymers of hydroxy-containing monomers such as vinyl phenol and 2-hydroxyethyl methacrylate, polyvinyl alcohol, etc. Representative reactive derivatives include sulfonic and carboxylic acid, ester or amide derivatives of the diazonaphthoquinone moiety.

Derivatization of phenolic resins with compounds that contain the diazonaphthoquinone moiety is known in the art and is described, for example, in U.S. Pat. Nos. 5,705,308, and 5,705,322 to West, et al. An example of a resin derivatized with a compound that comprises a diazonaphthoquinone moiety is P-3000 (available from PCAS, France), a naphthoquinone diazide of a pyrogallol/acetone resin.

Underlayer

The underlayer is between the hydrophilic surface of the substrate and the top layer. After imaging, it is removed by the developer in the exposed regions to reveal the underlying hydrophilic surface of the substrate.

The underlayer comprises a polymeric material that is preferably soluble in the developer to prevent sludging of the developer. In addition, the polymeric material is preferably insoluble in the solvent used to coat the top layer so that the top layer can be coated over the underlayer without dissolving the underlayer.

The polymeric material in the underlayer may provide resistance to solvents and common printing room chemicals, such as fountain solution, inks, plate cleaning agents, and blanket washing agents, as well as to alcohol substitutes, which are used in fountain solutions. The underlayer may also be resistant to rinsing agents having a high content of esters, ethers, and ketones, which are used, for example, with ultraviolet curable inks.

In the practice of one embodiment of the present invention, the underlayer of the imageable element includes a copolymer comprising in polymerized form:

a) constitutional units derivable from a monomer having a cyclic urea group;

b) constitutional units derivable from N-phenylmaleimide, N-cyclohexylmaleimide, N-benzylmaleimide, N-(p-carboxyphenyl)maleimide, or a combination thereof;

c) constitutional units derivable from acrylamide, methacrylamide, N-methoxymethylmethacrylamide, methoxymethylmethacrylate, or a combination thereof; and d) constitutional units derivable from acrylic acid, methacrylic acid, vinyl benzoic acid, or a combination thereof.

The copolymer includes constitutional units A that are derivable from one or a combination of monomers, each having a cyclic urea group. In one embodiment, the copolymer comprises about 3 to about 50 mol-%, more suitably about 10 to about 30 mol-%, most suitably about 15 to about 30 mol-%, of constitutional units A derivable from monomer(s) having a cyclic urea group.

In an embodiment of the invention, the monomer or monomers are represented by:

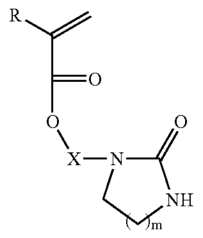

in which R is hydrogen or methyl, X is ($C_2$–$C_{12}$) alkyl, and m is 1 to 3. R and the ($C_2$–$C_{12}$) alkyl group may be hydrocarbyl, or may be substituted.

One suitable monomer having a cyclic urea group is N-(2-methacryloyloxyethyl)ethylene, a polymerizable monomer represented by:

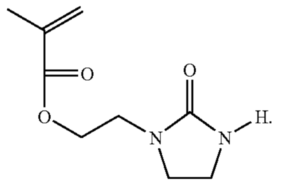

N-(2-methacryloyloxyethyl)ethylene is commercially available from Degussa (Darmstadt, Germany) under the trade name PLEX 6852-0. In some embodiments, the copolymer comprises about 3 to about 50 mol-%, more suitably about 10 to about 30 mol-%, most suitably about 15 to about 30 mol-% of constitutional units derivable from N-(2-methacryloyloxyethyl)ethylene.

The copolymer also includes constitutional units B that are derivable from N-phenyl-maleimide, N-cyclohexylmaleimide, N-benzylmaleimide, N-(p-carboxyphenyl)maleimide, or a combination thereof. In one embodiment, the copolymer comprises about 20 to about 75 mol-%, more suitably about 20 to about 50 mol-%, most suitably about 30 to about 45 mol-% of such constitutional units. In some embodiments, the copolymer comprises about 20 to about 75 mol-%, more suitably about 20 to about 50 mol-%, most suitably about 30 to about 45 mol-% of constitutional units derivable from N-phenylmaleimide.

The copolymer includes constitutional units C that are derivable from acrylamide, methacrylamide, N-methoxymethylmethacrylamide, methoxymethylmethacrylate, or a combination thereof. In one embodiment, the copolymer comprises about 15 to about 50 mol-%, more suitably about 15 to about 40 mol-%, and most suitably about 15 to about 30 mol-% of such constitutional units. In some embodiments, the copolymer comprises about 15 to about 50 mol-%, more suitably about 15 to about 40 mol-%, and most suitably about 15 to about 30 mol-% of constitutional units derivable from methacrylamide. In other embodiments, the copolymer comprises about 15 to about 50 mol-%, more suitably about 15 to about 40 mol-%, and most suitably about 15 to about 30 mol-% of constitutional units derivable from N-methoxymethylmethacrylamide.

The copolymer includes constitutional units D that are derivable from acrylic acid, methacrylic acid, vinyl benzoic acid, or a combination thereof. In one embodiment, the copolymer comprises about 5 to about 40 mol-%, more suitably about 10 to about 30 mol-%, most suitably about 15 to about 25 mol-% of such constitutional units. In some embodiments, the copolymer comprises about 5 to about 40 mol-%, more suitably about 10 to about 30 mol-%, most suitably about 15 to about 25 mol-% of constitutional units derivable from methacrylic acid.

In one embodiment of the imageable element, the underlayer includes a copolymer comprising in polymerized form:

a) about 3 to about 50 mol-% of constitutional units derivable from a monomer having the cyclic urea group;

b) about 20 to about 75 mol-% of constitutional units derivable from N-phenyl-maleimide, N-cyclohexylmaleimide, N-benzylmaleimide, N-(p-carboxyphenyl)maleimide, or a combination thereof;

c) about 15 to about 50 mol-% of constitutional units derivable from acrylamide, methacrylamide, N-methoxymethylmethacrylamide, methoxymethylmethacrylate, or a combination thereof; and d) about 5 to about 40 mol-% of constitutional units derivable from acrylic acid, methacrylic acid, vinyl benzoic acid, or a combination thereof.

In another embodiment, the underlayer includes a copolymer comprising, in polymerized form:

a) about 3 to about 50 mol-% of constitutional units derivable from the polymerizable monomer represented by:

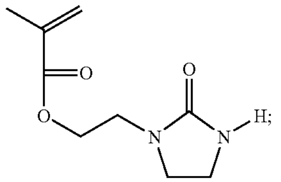

b) about 20 to about 75 mol-% of constitutional units derivable from N-phenylmaleimide;

c) about 15 to about 50 mol-% of constitutional units derivable from methacrylamide, N-methoxymethylmethacrylamide, or a combination thereof; and d) about 5 to about 40 mol-% of constitutional units derivable from methacrylic acid.

In yet another embodiment, the underlayer includes a copolymer comprising, in polymerized form:

a) about 10 to about 30 mol-% of constitutional units derivable from the polymerizable monomer represented by:

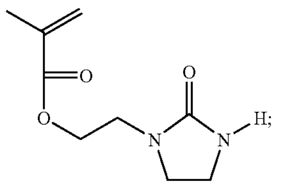

b) about 20 to about 50 mol-% of constitutional units derivable from N-phenylmaleimide;

c) about 15 to about 40 mol-% of constitutional units derivable from methacrylamide, N-methoxymethylmethacrylamide, or a combination thereof; and d) about 10 to about 30 mol-% of constitutional units derivable from methacrylic acid.

The copolymers described above may additionally comprise constitutional units derivable from other monomers not already specified. By way of example, the copolymer may additionally comprise about 10 to about 60 mol-%, more suitably about 20 to about 50 mol-%, of constitutional units derivable from acrylonitrile or methacrylonitrile. Alternatively or in conjunction, the copolymer may additionally comprise about 10 to about 40 mol-% of constitutional units derivable from maleic anhydride. Another suitable monomer may include N-[2-(2-oxo-1-imidazolidinyl)ethyl]methacrylamide, as reported in U.S. Pub. App. 2005/0079432.

In the practice of another embodiment of the present invention, the underlayer of the imageable element includes a copolymer comprising in polymerized form:

a) constitutional units derivable from a monomer having a cyclic urea group;

b) constitutional units derivable from acrylic acid, methacrylic acid, vinyl benzoic acid, or a combination thereof; and c) constitutional units derivable from acrylonitrile, methacrylonitrile, or a combination thereof.

The copolymer includes constitutional units A that are derivable from one or a combination of monomers, each having a cyclic urea group. In one embodiment, the copolymer comprises about 3 to about 50 mol-%, more suitably about 10 to about 30 mol-%, most suitably about 15 to about 30 mol-%, of constitutional units A derivable from monomer(s) having a cyclic urea group. Suitable monomers A include those described above.

The copolymer includes constitutional units B that are derivable from acrylic acid, methacrylic acid, vinyl benzoic acid, or a combination thereof. In one embodiment, the copolymer comprises about 5 to about 40 mol-%, more suitably about 10 to about 30 mol-%, most suitably about 15 to about 25 mol-% of such constitutional units. In some embodiments, the copolymer comprises about 5 to about 40 mol-%, more suitably about 10 to about 30 mol-%, most suitably about 15 to about 25 mol-% of constitutional units derivable from methacrylic acid.

The copolymer includes constitutional units C that are derivable from acrylonitrile, methacrylonitrile, or a combination thereof. By way of example, the copolymer may comprise about 5 to about 75 mol-%, suitably about 15 to about 65 mol-%, more suitably about 20 to about 55 mol-%, and most suitably about 25 to about 50 mol-% of constitutional units derivable from acrylonitrile or methacrylonitrile.

In one embodiment of the imageable element, the underlayer includes a copolymer comprising in polymerized form:

a) about 3 to about 50 mol-% of constitutional units derivable from a monomer having the cyclic urea group;

b) about 5 to about 40 mol-% of constitutional units derivable from acrylic acid, methacrylic acid, vinyl benzoic acid, or a combination thereof; and c) about 5 to about 75 mol-% of constitutional units derivable from acrylonitrile, methacrylonitrile, or a combination thereof.

In another embodiment, the underlayer includes a copolymer comprising, in polymerized form:

a) about 3 to about 50 mol-% of constitutional units derivable from the polymerizable monomer represented by:

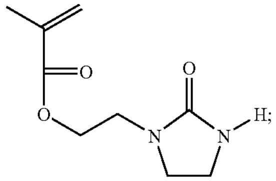

b) about 5 to about 40 mol-% of constitutional units derivable from methacrylic acid; and c) about 5 to about 75 mol-% of constitutional units derivable from acrylonitrile.

In yet another embodiment, the underlayer includes a copolymer comprising, in polymerized form:

a) about 10 to about 30 mol-% of constitutional units derivable from the polymerizable monomer represented by:

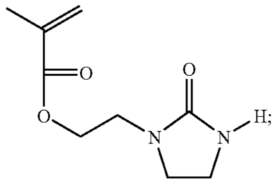

b) about 10 to about 30 mol-% of constitutional units derivable from methacrylic acid; and c) about 15 to about 65 mol-% of constitutional units derivable from acrylonitrile.

The copolymer of any of the foregoing embodiments may further comprise constitutional units derivable from N-phenyl-maleimide, N-cyclohexylmaleimide, N-benzylmaleimide, N-(p-carboxyphenyl)maleimide, or a combination thereof. In one embodiment, the copolymer comprises about 20 to about 75 mol-%, more suitably about 20 to about 50 mol-%, most suitably about 30 to about 45 mol-% of such constitutional units. In some embodiments, the copolymer comprises about 20 to about 75 mol-%, more suitably about 20 to about 50 mol-%, most suitably about 30 to about 45 mol-% of constitutional units derivable from N-phenylmaleimide.

The copolymers described above may additionally comprise constitutional units derivable from other monomers not already specified. By way of example, the copolymer may additionally comprise about 10 to about 40 mol-% of constitutional units derivable from maleic anhydride, or about 5 to about 25 mol-% of constitutional units derivable from methylmethacrylate. The copolymer may additionally comprise about 15 to about 50 mol-% of constitutional units derivable from acrylamide, methacrylamide, N-methoxymethylmethacrylamide, methoxymethylmethacrylate, or a combination thereof. Another suitable monomer may include N-[2-(2-oxo-1-imidazolidinyl)ethyl]methacrylamide, as reported in U.S. Pub. App. 2005/0079432.

In one embodiment, the underlayer comprises about 30 wt.-% to 100 wt.-% of a copolymer described above, based on the weight of the underlayer. For the practice of the present invention, the weight-average molecular weight of the copolymer is suitably in the range from about 500 Da to about 1,000 kDa, most suitably in the range from about 2 kDa to 250 kDa.

Although the polymeric material described above is referred to as a "copolymer" this does not imply that the material must be prepared by copolymerization of the indicated monomers. Any copolymer meeting the description herein, however prepared, is suitable for use in the invention. In most situations, the copolymeric material is a random copolymer having the stated constitutional units, although ordered copolymers may be suitable for some applications.

The copolymers described above can be prepared by polymerization methods, such as free-radical polymerization, which are well known to those skilled in the art as described, for example, in Chapters 20 and 21, of *Macromolecules*, Vol. 2, 2nd Ed., H. G. Elias, Plenum, N.Y., 1984. Useful free-radical initiators are peroxides such as benzoyl peroxide, hydroperoxides such as cumyl hydroperoxide and azo compounds such as 2,2'-azobis(isobutyronitrile) (AIBN). Suitable solvents include liquids that are inert to the reactants and which will not otherwise adversely affect the reaction. Typical solvents include, for example, esters such as ethyl acetate and butyl acetate; ketones such as methyl ethyl ketone, methyl isobutyl ketone, methyl propyl ketone, and acetone; alcohols such as methanol, ethanol, isopropyl alcohol, and butanol; ethers such as dioxane and tetrahydrofuran, and mixtures thereof.

The copolymers described above are soluble in conventional developers, such as aqueous alkaline developers. Preferably the copolymer used in the underlayer is soluble in a wholly aqueous developer, i.e. one that does not include added organic solvents. In addition, the copolymers may be soluble in polar solvents, such as propylene glycol monomethyl ether, which can be used as the coating solvent for the underlayer. However, they are poorly soluble in less polar solvents, such as 2-butanone (methyl ethyl ketone) or 3-pentanone (diethyl ketone), which can be used as a solvent to coat the top layer over the underlayer without dissolving the underlayer.

Other components, such as resins that have activated methylol and/or activated alkylated methylol groups, other copolymers, photothermal conversion materials, and surfactants, may also be present in the underlayer.

The underlayer may comprise a resin or resins having activated methylol and/or activated alkylated methylol groups. Such resins include, for example: resole resins and their alkylated analogs; methylol melamine resins and their alkylated analogs, for example melamine-formaldehyde resins; methylol glycoluril resins and alkylated analogs, for example, glycoluril-formaldehyde resins; thiourea-formaldehyde resins; guanamine-formaldehyde resins; and benzoguanamine-formaldehyde resins. Commercially available melamine-formaldehyde resins and glycoluril-formaldehyde resins include, for example, CYMEL resins (Dyno Cyanamid) and NIKALAC resins (Sanwa Chemical).

The resin or resins having activated methylol and/or activated alkylated methylol groups is preferably a resole resin or a mixture of resole resins. Resole resins are well-known to those skilled in the art. They are prepared by reaction of a phenol with an aldehyde under basic conditions using an excess of phenol. Commercially available resole resins include, for example, GP649D99 resole (Georgia Pacific) and BKS-5928 resole resin (Union Carbide).

When present, the resole resin typically comprises about 7 wt.-% to about 15 wt.-%, preferably about 8 wt.-% to about 12 wt.-%, more preferably about 10 wt.-% of the underlayer, based on the total weight of the underlayer.

The underlayer may comprise additional copolymers to enhance or modify the properties of the underlayer. By way of example, combinations of alkaline developer soluble polymeric materials may be used in the underlayer to provide improved chemical resistance, i.e., resistance to both fountain solution and to aggressive washes.

Suitable copolymers are described, for example, in U.S. Pat. No. 6,475,692 to Jarek, et al., U.S. Pat. No. 6,475,698 to Monk, et al., and U.S. Pat. No. 6,645,689 to Jarek. By way of example, a copolymer comprising monomers derived from N-phenylmaleimide, methacrylamide, and methacrylic acid may be suitable, as reported in U.S. Pat. No. 6,294,311 to Shimazu, et al., and U.S. Pat. No. 6,528,228 to Savariar-Hauck, et al. Other suitable copolymers are described in U.S. patent application Ser. No. 10/641,888 (U.S. Pub. App. 2005/0037292) filed Aug. 14, 2003; U.S. patent application Ser. No. 10/681,701 (U.S. Pub. App. 2005/0079432) filed Oct. 8, 2003 and U.S. Pat. No. 6,893,783; and U.S. patent application Ser. No. 11/018,335 filed Dec. 21, 2004; the disclosure of each of which is incorporated herein by reference.

When a photothermal conversion material is present in the underlayer, it typically comprises about 0.1 wt.-% to about 25 wt.-%, more suitably about 5 wt.-% to about 20 wt.-%, most suitably about 10 wt.-% to 15 wt.-%, of the underlayer, based on the total weight of the underlayer. When a surfactant is present in the underlayer, it typically comprises 0.05 wt.-% to about 1 wt.-%, preferably about 0.1 wt.-% to about 0.6 wt.-%, more preferably about 0.2 wt.-% to 0.5 wt.-%, based on the total weight of the underlayer.

In addition to the components described above, the underlayer can include one or more additional components such as a dye or pigment for increasing the contrast of the image, an exposure indicator, a plasticizer and mixtures thereof.

The exposure indicators suitable for use in the underlayer are known to the person skilled in the art. Exposure indicators selected from triarylmethane dyes, such as Victoria Pure Blue BO, Victoria Blue R, and crystal violet, or azo dyes, such as 4-phenylazodiphenylamine, azobenzene or 4-N,N-dimethylaminoazobenzene, are suitable. The exposure indicators may be present in the underlayer in an amount from 0.02 to 10% by weight, especially preferred in an amount from 0.5 to 6% by weight.

Suitable dyes for increasing the contrast of the image include those which dissolve well in the solvent or solvent mixture used for the coating or which can be introduced as a pigment in particulate form. Suitable contrast dyes include, for example, rhodamine dyes, methyl violet, anthraquinone pigments and phthalocyanine dyes or pigments.

Suitable plasticizers include dibutylphthalate, triarylphosphate and dioctylphthalate. Dioctylphthalate is especially suitable. The plasticizer is suitably used in an amount of 0.25 to 2% by weight.

Other Layers

When a separate layer comprising the photothermal conversion material is present, it is between the top layer and the underlayer. It may be possible to use less of the photothermal conversion material if it is present in a separate absorber layer. In one embodiment, the separate layer (the "absorber layer") comprises the photothermal conversion material and optionally a surfactant. In another embodiment, the absorber layer consists essentially of the photothermal conversion material. The absorber layer preferably has a thickness sufficient to absorb at least 90%, preferably at least 99%, of the imaging radiation. Typically, the absorber layer has a coating weight of about 0.02 $g/m^2$ to about 2 $g/m^2$, more suitably about 0.05 $g/m^2$ to about 1.5 $g/m^2$. Elements that comprise an absorber layer are reported in U.S. Pat. No. 6,593,055 to Shimazu, et al., the disclosure of which is incorporated herein by reference.

To further minimize migration of the photothermal conversion material into the top layer during manufacture and storage of the imageable element, the element may comprise a barrier layer between the underlayer (or absorber layer) and the top layer. The barrier layer generally comprises a polymeric material that is soluble in the developer. If this polymeric material is different from the polymeric material in the underlayer, it is preferably soluble in at least one organic solvent in which the polymeric material in the underlayer is insoluble. A preferred polymeric material for the barrier layer is polyvinyl alcohol. When the polymeric material in the barrier layer is different from the polymeric material in the underlayer, the barrier layer should be less than about one-fifth as thick as the underlayer, preferably less than a tenth of the thickness of the underlayer. Imageable elements that comprise a barrier layer are reported in U.S. Pat. No. 6,723,490 to Patel, et al., the disclosure of which is incorporated herein by reference.

Preparation of the Imageable Element

The imageable element may be prepared by sequentially applying the underlayer over the hydrophilic surface of the substrate; applying the absorber layer and/or the barrier layer if present, over the underlayer; and then applying the top layer using conventional techniques. It is important to avoid intermixing the underlayer and top layer.

The terms "solvent" and "coating solvent" include mixtures of solvents. These terms are used although some or all of the materials may be suspended or dispersed in the solvent rather than in solution. Selection of coating solvents depends on the nature of the components present in the various layers.

The underlayer may be applied by any conventional method, such as coating or lamination. Typically the ingredients are dispersed or dissolved in a suitable coating solvent, and the resulting mixture coated by conventional methods, such as spin coating, bar coating, gravure coating, die coating, or roller coating. The underlayer may be applied, for example, from mixtures of methyl ethyl ketone, 1-methoxypropan-2-ol, butyrolactone, and water; from mixtures of diethyl ketone, water, methyl lactate, and butyrolactone; from mixtures of diethyl ketone, water, and methyl lactate; or from mixtures of dioxolane, propylene glycol monomethyl ether, butyrolactone, and water.

When neither a barrier layer nor an absorber layer is present, the top layer is coated on the underlayer. To prevent the underlayer from dissolving and mixing with the top layer, the top layer should be coated from a solvent in which the underlayer layer is essentially insoluble. Thus, the coating solvent for the top layer should be a solvent in which the components of the top layer are sufficiently soluble that the top layer can be formed and in which any underlying layers are essentially insoluble. Typically, the solvents used to coat the underlying layers are more polar than the solvent used to coat the top layer. The top layer may be applied, for example, from toluene, propyleneglycol acetate, n-butanol, iso-propyl alcohol, butyl acetate, 2-butanone, diethyl ketone, or from mixtures of diethyl ketone and 1-methoxy-2-propyl acetate. An intermediate drying step, i.e., drying the underlayer, if present, to remove coating solvent before coating the top layer over it, may also be used to prevent mixing of the layers.

Alternatively, the underlayer, the top layer or both layers may be applied by conventional extrusion coating methods from a melt mixture of layer components. Typically, such a melt mixture contains no volatile organic solvents.

Imaging and Processing

The imageable element of the present invention may be thermally imaged with a laser or an array of lasers emitting modulated near-infrared or infrared radiation in a wavelength region that is absorbed by the imageable element. Infrared radiation, especially infrared radiation in the range of about 800 nm to about 1200 nm, is typically used for imaging. Imaging is conveniently carried out with a laser emitting at about 830 nm, about 1056 nm, or about 1064 nm. Suitable commercially available imaging devices include imagesetters such as the Creo TRENDSETTER (Creo, Burnaby, British Columbia, Canada), the Screen PLATERITE model 4300, model 8600, and model 8800 (Screen, Rolling Meadows, Chicago, Ill.), and the Gerber CRESCENT 42T (Gerber).

Alternatively, the imageable element may be thermally imaged using a hot body, such as a conventional apparatus containing a thermal printing head. A suitable apparatus includes at least one thermal head but would usually include a thermal head array, such as a TDK Model No. LV5416 used in thermal fax machines and sublimation printers, the GS618-400 thermal plotter (Oyo Instruments, Houston, Tex.), or the Model VP-3500 thermal printer (Seikosha America, Mahwah, N.J.).

In either case, the image signals are generally stored as a bitmap data file on a computer. Such files may be generated by a raster image processor (RIP) or other suitable means. The bitmaps are constructed to define the hue of the color as well as screen frequencies and angles.

Imaging of the imageable element produces a latent image of exposed and complementary unexposed regions. Developing the exposed element to form a developed element (which may be suitable as a printing plate) converts the latent image to an image by removing the exposed regions of the top layer and the underlayer, revealing the hydrophilic surface of the underlying substrate. The element is positive-working, in that the underlayer and top layer are removed in the exposed regions. The exposed regions become the non-ink accepting regions, and the unexposed regions remain ink-accepting.

While not being bound by any theory or explanation, it is thought that a thermally frangible complex is formed between the solubility-suppressing component and the polymeric material. When the element is heated, typically by imagewise thermal exposure, the thermally frangible complex breaks down. The developer penetrates the exposed regions of the top layer much more rapidly than it penetrates the unexposed regions. The underlying regions of the underlayer are removed along with the exposed regions of the top layer, revealing the underlying hydrophilic surface of the substrate.

Suitable developers depend on the solubility characteristics of the components present in the imageable element. The developer may be any liquid or solution that can penetrate and remove the exposed regions of the imageable element without substantially affecting the complementary unexposed regions. While not being bound by any theory or explanation, it is believed that image discrimination is based on a kinetic effect. The exposed regions of the top layer are removed more rapidly in the developer than the unexposed regions. Development is carried out by contacting the exposed element with a developer for a time suitable to remove the exposed regions of the top layer and the underlying regions of the other layer or layers of the element, but not long enough to remove the unexposed regions of the top layer. Typically, the underlayer is dissolved in the developer and the top layer is dissolved and/or dispersed in the developer. Hence, the top layer is described as being "not removable" by, or "insoluble" in, the developer prior to imaging, and the exposed regions are described as being "soluble" in, or "removable" by, the developer because they are removed, i.e. dissolved and/or dispersed, more rapidly in the developer than the unexposed regions. However, it will be appreciated that, if the exposed element is developed for a long enough time, both the exposed and the unexposed regions will be dissolved.

High-pH aqueous-based developers can be used. High-pH developers typically have a pH of at least about 11, more typically at least about 12, even more typically from about 12 to about 14. High-pH developers also typically comprise at least one alkali metal silicate, such as lithium silicate, sodium silicate, and/or potassium silicate, and are typically substantially free of organic solvents. The alkalinity can be provided by using a hydroxide or an alkali metal silicate, or a mixture. Suitable hydroxides are ammonium, sodium, lithium and, especially potassium hydroxides. The alkali metal silicate has a typical $SiO_2$ to $M_2O$ weight ratio of at least 0.3 (where M is the alkali metal), suitably this ratio is from 0.3 to 1.2, more suitably 0.6 to 1.1, most suitably 0.7 to 1.0. The amount of alkali metal silicate in the developer is at least 20 g $SiO_2$ per 100 g of composition and more suitably from 20 to 80 g, most suitably it is from 40 to 65 g. High-pH developers can be used in an immersion processor. Wholly aqueous developers, i.e., those that do not comprise an added organic solvent, are preferred.

The developer may also comprise a surfactant or a mixture of surfactants. The surfactant or mixture of surfactants typically comprises about 0.5 wt.-% to about 15 wt.-% based on the weight of the developer, preferably about 3 wt.-% to about 8 wt.-%, based on the weight of the developer. The developer may also comprise a buffer system to keep the pH relatively constant. Numerous buffer systems are known to those skilled in the art. Water typically comprises the balance of the developer.

Typical high-pH aqueous alkaline developers include PC9000, PC3000, GOLDSTAR, GREENSTAR, THERMALPRO, PROTHERM, MX1813, and MX1710, all available from Kodak Polychrome Graphics (Norwalk, Conn.). Another useful developer, T183-5, contains 200 parts of GOLDSTAR developer, 4 parts of polyethylene glycol (PEG) 1449, 1 part of sodium metasilicate pentahydrate, and 0.5 part of TRITON H-22 surfactant (phosphate ester surfactant).

Alternatively, the imaged imageable elements can be developed using a solvent-based developer in an immersion processor or a spray-on processor. Solvent-based alkaline developers, which are typically used with negative working imageable elements, are suitable developers for use with the imageable elements of this invention. Solvent-based developers comprise an organic solvent or a mixture of organic solvents. The organic solvent is typically present in the developer at a concentration of between about 0.5 wt.-% to about 15 wt.-%, based on the weight of the developer, preferably between about 3 wt.-% and about 5 wt.-%, based on the weight of the developer. Useful commercially available solvent-based developers include ND-1 Developer, 956 Developer, 955 Developer, and SP200 available from Kodak Polychrome Graphics.

Typically the developer is applied to the imaged element by rubbing or wiping the top layer with an applicator containing the developer. Alternatively, development may carried out in a processor equipped with an immersion-type developing bath, a section for rinsing with water, a gumming section, a drying section, and a conductivity-measuring unit. In another method, the imaged element may be brushed with the developer or the developer may be applied to the element by spraying the top layer with sufficient force to remove the exposed regions. In any case, a developed element is produced.

Commercially available spray on-processors include the 85 NS (Kodak Polychrome Graphics). Commercially available immersion processors include the MERCURY MARK V processor (Kodak Polychrome Graphics); the Global Graphics TITANIUM processor (Global Graphics, Trenton, N.J.); and the Glunz and Jensen QUARTZ 85 processor (Glunz and Jensen, Elkwood, Va.).

Following development, the resulting printing plate is generally rinsed with water and dried. Drying may be conveniently carried out by infrared radiators or with hot air. After drying, the printing plate may be treated with a gumming solution comprising one or more water-soluble polymers, for example polyvinyl alcohol, polymethacrylic acid, polymethacrylamide, polyhydroxyethylmethacrylate, polyvinylmethylether, gelatin, and polysaccharide such as dextrine, pullulan, cellulose, gum arabic, and alginic acid. A commonly used material is gum arabic.

The developed and optionally gummed plate can be optionally baked to increase the press runlength of the plate. Baking can be carried out, for example, at about 220° C. to about 260° C. for about 5 min to about 15 min, or at a temperature of about 110° C. to about 130° C. for about 25 to about 35 min.

Once the imageable element has been imaged and developed to form a lithographic printing plate, printing can then be carried out by applying a fountain solution and lithographic ink to the image on its surface. The fountain solution is taken up by the unimaged regions, i.e., the surface of the hydrophilic substrate revealed by the imaging and development process, and the ink is taken up by the imaged regions, i.e., the regions not removed by the development process. The ink is then transferred to a suitable receiving material (such as cloth, paper, metal, glass or plastic) either directly or indirectly using an offset printing blanket to provide a desired impression of the image thereon.

EXAMPLES

Glossary of Chemicals Used in Synthesis of Copolymers and in Coating Formulations ACR1478: Copolymer of N-phenylmaleimide/methacrylamide/methacrylic acid 42/37.5/21.5 (mol-%), supplied by Clariant (Germany)

AIBN: 2,2'-Azo bis-isobutyronitrile, such as VAZO-64 available from E.I. du Pont de Nemours and Co. (Wilmington, Del.)

Butyl CELLOSOLVE: Glycol ether solvent from Dow Chemical Co. (Midland, Mich.)

BYK307: Polyethoxylated dimethylpolysiloxane copolymer as supplied by BYK Chemie (Wallingford, Conn.)

D11 Dye: Triarylmethane dye (CAS number 433334-19-1) available from PCAS (Longjumeau, France) represented by the structure:

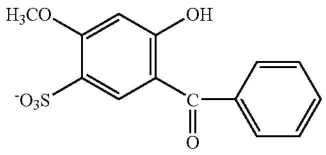

-continued

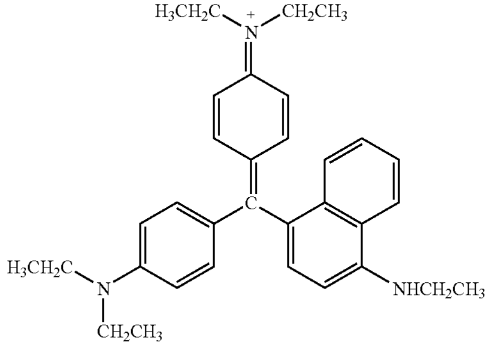

N-[4-[[4-(diethylamino)phenyl][4-(ethylamino)-1-naphthalenyl]methylene]-2,5-cyclohexadien-1-ylidene]-N-ethyl ethanaminium, 1:1: salt with 5-benzoyl-4-hydroxy-2-methoxybenzenesulfonic acid DOWANOL PMA: Propylene glycol methyl ether acetate from Dow Chemical Co.

Ethyl Violet: Basic violet 4, C.I. 42600, as supplied by Aldrich Chemical Company (Milwaukee, Wis.)

IR Dye A: IR dye used in coating formulations, represented by the structure:

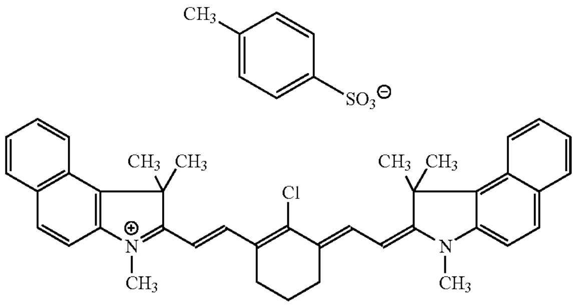

ND-1: ND-1 Negative Developer supplied by Kodak Polychrome Graphics (Norwalk, Conn.)

PD140A: Novolac resin (75% m-cresol, 25% p-cresol; mw 7000) as supplied by Borden Chemical (Louisville, Ky.)

P3000: 215 naphthoquinonediazide sulfonate ester of pyrogallol acetone condensate as supplied by PCAS (Longjumeau, France)

PLEX 6852-0: N-(2-methacryloyloxyethyl)ethylene, a polymerizable monomer comprising a cyclic urea; supplied by Degussa (Darmstadt, Germany) as a 50% solution in water and having the structure:

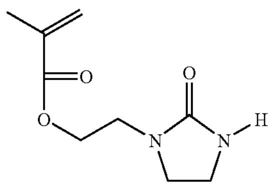

SMA 1000: Styrene-maleic anhydride copolymer from Sartomer Co. (Exton, Pa.)

Substrate A: 0.3 gauge aluminum sheet, electrograined, anodized, and treated with a solution of polyvinylphosphonic acid

SWORD EXCEL

Thermal Printing Plate: Supplied by Kodak Polychrome Graphics

TN-13: m-cresol novolac tosylated to 15 mol-% from Eastman Kodak (Rochester, N.Y.)

T183-5 Developer: Aqueous alkaline developer, composed of 200 parts GOLDSTAR developer, 4 parts PEG 1449, 1 part sodium metasilicate pentahydrate, and 0.5 part TRITON H-22 surfactant 956 Developer: Solvent-based developer containing phenoxyethanol, as supplied by Kodak Polychrome Graphics

Examples 1–12

Synthesis of Copolymers

Example 1

Synthesis of MMA-3

MMA-3, a copolymer of 92% mol-% methylmethacrylate/8% mol-% methacrylic acid, was synthesized as follows:

A 500-mL reaction vessel was fitted with a heating mantle, stirrer, thermometer, condenser, and nitrogen atmosphere. A mixture of methacrylic acid (3.48 g), methyl methacrylate (46.52 g) and 50:50 (v:v) dioxolane/ethanol (136.01 g) was introduced to the vessel and heated to 60° C. under a nitrogen atmosphere. Nitrogen was bubbled through the solution for 1 h.

Then the nitrogen inlet was removed from the mixture, and a mixture of AIBN (0.054 g) in dioxolane (0.50 g) was added. The reaction mixture was heated under nitrogen for 24 h at 60° C., during which an additional portion of AIBN (0.054 g) in dioxolane (0.50 g) was added each hour.

The reaction mixture was cooled to room temperature, and the resulting copolymer was isolated by slowly adding the reaction mixture, with stirring, to 1 L of water to which 5 drops of concentrated hydrochloric acid had been added. The copolymer was filtered, washed with 1 L of water, filtered again, and dried for 2 days at 50° C. 47.60 g of copolymer was obtained, for a yield of 95%.

Example 2

Synthesis of Copolymer 1

Copolymer 1, a copolymer of 30 mol-% N-phenylmaleimide/30 mol-% methacrylamide/25 mol-% methacrylic acid/15 mol-% PLEX 6852-0, was synthesized as follows:

1. A 1 -L four-necked round bottom flask was equipped with a condenser, a nitrogen supply, a thermometer, a stirrer, and a heating mantle.

2. The following reactants were introduced into the reaction vessel: PLEX 6852-0 (11.55 g), methacrylamide (4.96 g), N-phenylmaleimide (10.09 g), methacrylic acid (4.18 g), and 90:10 (v:v) 1,3-dioxolane/water (451.41 g).

3. A nitrogen bubbler was connected to the inlet. The nitrogen outlet (i.e., the top of the condenser) was connected to a Dreschel bottle, and positive nitrogen pressure was maintained. Nitrogen supply was provided for one hour as the temperature was raised to 60° C.

4. A mixture of AIBN (0.034 g) in dioxolane (0.50 g) was added to the reaction mixture.

5. The reaction mixture was stirred for 24 hours under nitrogen at a constant 60° C.

6. The resulting copolymer was isolated by precipitation. The copolymer solution was added slowly, with stirring, to 1 L of 80:20 (v:v) ethanol/water to which 5 drops of concentrated hydrochloric acid had been added. The precipitate was filtered, washed with 1 L 80:20 (v:v) ethanol/water, and filtered again.

7. The filtrate was dried to constant weight (about 2 days) at 40° C.

23.48 g of Copolymer 1 was obtained, for a yield of 76%.

Example 3

Synthesis of Copolymer 2

Copolymer 2 was synthesized according to the method outlined in Example 2. 22.90 g of Copolymer 2 was obtained, for a yield of 74%.

Example 4

Synthesis of Copolymer 3

Copolymer 3, a copolymer of 30 mol-% N-phenylmaleimide/30 mol-% methacrylamide/20 mol-% methacrylic acid/20 mol-% PLEX 6852-0, was synthesized according to the method outlined in Example 2. The reactants used in step 2 were PLEX 6852-0 (59.02 g), methacrylamide (19.0 g), N-phenylmaleimide (38.67 g), and methacrylic acid (12.82 g). 96.12 g of Copolymer 3 was obtained, for a yield of 74%.

Example 5

Synthesis of Copolymer 4

Copolymer 4, a copolymer of 35 mol-% N-phenylmaleimide/30 mol-% methacrylamide/15 mol-% methacrylic acid/20 mol-% PLEX 6852-0, was synthesized according to the method outlined in Example 2. The reactants used in step 2 were PLEX 6852-0 (22.87 g), methacrylamide (7.36 g), N-phenylmaleimide (17.48 g), methacrylic acid (3.72 g). 39.39 g of Copolymer 4 was obtained, for a yield of 77%.

Example 6

Synthesis of Copolymer 5

Copolymer 5, a copolymer of 30 mol-% N-phenylmaleimide/30 mol-% methacrylamide/15 mol-% methacrylic acid/25 mol-% PLEX 6852-0, was synthesized according to the method outlined in Example 2. The reactants used in step 2 were PLEX 6852-0 (28.33 g), methacrylamide (7.30 g), N-phenylmaleimide (14.85 g), methacrylic acid (3.69 g). 39.79 g of Copolymer 5 was obtained, for a yield of 73%.

Example 7

Synthesis of Copolymer 6

Copolymer 6, a copolymer of 40 mol-% N-phenylmaleimide/25 mol-% methacrylamide/15 mol-% methacrylic acid/20 mol-% PLEX 6852-0, was synthesized according to the method outlined in Example 2. The reactants used in step 2 were PLEX 6852-0 (22.16 g), methacrylamide (5.95 g), N-phenylmaleimide (19.36 g), methacrylic acid (3.61 g). 39.79 g of Copolymer 6 was obtained, for a yield of 79%.

Example 8

Synthesis of Copolymer 7

Copolymer 7, a copolymer of 30 mol-% N-phenylmaleimide/30 mol-% N-methoxymethyl methacrylamide/25 mol-% methacrylic acid/15 mol-% PLEX 6852-0, was synthesized according to the method outlined in Example 2. The reactants used in step 2 were PLEX 6852-0 (10.47 g), N-methoxymethylmethacrylamide (6.82 g), N-phenyl maleimide (9.15 g), methacrylic acid (3.79 g). 22.59 g of Copolymer 7 was obtained, for a yield of 72%.

Example 9

Synthesis of Copolymer 8

Copolymer 8, a copolymer of 30 mol-% N-phenylmaleimide/30 mol-% N-methoxymethyl methacrylamide/20 mol-% methacrylic acid/20 mol-% PLEX 6852-0, was synthesized according to the method outlined in Example 2. The reactants used in step 2 were PLEX 6852-0 (21.49 g), N-methoxymethylmethacrylamide (10.50 g), N-phenyl maleimide (14.08 g), methacrylic acid (4.67 g). 35.00 g of Copolymer 8 was obtained, for a yield of 69%.

Example 10

Synthesis of Copolymer 9

Copolymer 9, a copolymer of 30 mol-% N-phenylmaleimide/25 mol-% acrylonitrile/20 mol-% methacrylic acid/25 mol-% PLEX 6852-0, was synthesized according to the method outlined in Example 2. The reactants used in step 2 were PLEX 6852-0 (30.04 g), acrylonitrile (4.02 g), N-phenyl maleimide (15.74 g), methacrylic acid (5.22 g). 38.51 g of Copolymer 9 was obtained, for a yield of 70%.

Example 11

Synthesis of Copolymer 10

Copolymer 10, a copolymer of 40 mol-% N-phenylmaleimide/15 mol-% acrylonitrile/20 mol-% methacrylic acid/25 mol-% PLEX 6852-0, was synthesized according to the method outlined in Example 2. The reactants used in step 2 were PLEX 6852-0 (27.53 g), acrylonitrile (2.21 g), N-phenyl maleimide (19.24 g), methacrylic acid (4.78 g). (41.30 g, of Copolymer 10 was obtained, for a yield of 77%.

Example 12

Synthesis of Copolymer C11

Copolymer C11, a copolymer of 50 mol-% N-phenylmaleimide/5 mol-% methacrylamide/20 mol-% methacrylic acid/25 mol-% PLEX 6852-0, was synthesized according to the method outlined in Example 2. The reactants used in step 2 were PLEX 6852-0 (25.15 g), methacrylamide (1.08 g), N-phenyl maleimide (21.97 g), methacrylic acid (4.37 g). 38.62 g of Copolymer 11 was obtained, for a yield of 72%.

Example 13

Synthesis of Copolymer 12

Copolymer 12, a copolymer of 45 mol-% N-phenylmaleimide/15 mol-% methacrylamide/20 mol-% methacrylic acid/20 mol-% PLEX 6852-0, was synthesized as follows:

1. A 500-mL four-necked round bottom flask was equipped with a condenser, a nitrogen supply, a thermometer, a stirrer, and a heating mantle.

2. The following reactants were introduced into the reaction vessel: PLEX 6852-0 (39.6 g), methacrylamide (6.38 g), N-phenylmaleimide (38.96 g), methacrylic acid (8.61 g), and dimethylacetamide (221.3 g).

3. A nitrogen bubbler was connected to the inlet. Nitrogen was bubbled for one hour during which time the temperature was raised to 60° C.

4. AIBN (0.75 g) was added to the reaction mixture. A second addition of AIBN (0.18 g) was made after 6 hours.

5. The reaction mixture was stirred for 18 hours under nitrogen at a constant 60° C.

6. The resulting copolymer was isolated by precipitation in 1 L water to which 0.5 mL HCl (30 wt.-%) had been added. The precipitate was filtered, washed with 0.5 L water, and filtered again.

7. The polymer was dried to constant weight in a fluid bed dryer at 40° C.

57.9 g of Copolymer 12 was obtained, for a yield of 77.5%.

Example 14

Synthesis of Copolymer 13

Copolymer 13, a copolymer of 35 mol-% N-phenylmaleimide/17 mol-% methacrylamide/23 mol-% methacrylic acid/25 mol-% PLEX 6852-0, was synthesized as follows:

1. A 500-mL four-necked round bottom flask was equipped with a condenser, a nitrogen supply, a thermometer, a stirrer, and a heating mantle.

2. The following reactants were introduced into the reaction vessel: PLEX 6852-0 (113.58 g), methacrylamide (16.58 g), N-phenylmaleimide (69.46 g), methacrylic acid (22.69 g), and dimethylacetamide (252.3 g).

3. A nitrogen bubbler was connected to the inlet. Nitrogen was bubbled for one hour during which time the temperature was raised to 85° C.

4. AIBN (1.2 g) was added to the reaction mixture. Three further additions of 0.4 g AIBN at one-hour intervals were made as the temperature of the reaction mixture was maintained at 85° C.

5. After an additional one-hour period, the reaction mixture was allowed to cool. The resulting copolymer was isolated by precipitation in 2.6 L of water to which 1 mL of HCl (30 wt.-%) had been added. The precipitate was filtered, washed with 0.5 L water, and filtered again.

6. The polymer was dried to constant weight in a fluid bed dryer at 40° C.

160 g of Copolymer 13 was obtained, for a yield of 95%.

Example 15

Synthesis of Copolymer 14

Copolymer 14, a copolymer of 35 mol-% N-phenylmaleimide/20 mol-% N-methoxymethyl methacrylamide/20 mol-% methacrylic acid/25 mol-% PLEX 6852-0, was synthesized according to the method outlined in Example 13. The components used in step 2 were PLEX 6852-0 (49.5 g), N-methoxymethylmethacrylamide (12.92 g), N-phenyl maleimide (30.30 g), methacrylic acid (8.61 g) and 230 g mixture of dioxolane/methanol (1:1 w:w). 74.5 g of Copolymer 14 was obtained, for a yield of 96.0%.

Example 16

Synthesis of Copolymer 15

Copolymer 15, a copolymer of 35 mol-% N-phenylmaleimide/17 mol-% methacrylamide/22 mol-% methacrylic acid/26 mol-% PLEX 6852-0, was synthesized according to the method outlined in Example 14. The components used in step 2 were PLEX 6852-0 (51.54 g), methacrylamide (7.23 g), N-phenyl maleimide (30.30 g), methacrylic acid (9.47 g) and 217.8 g of dimethylacetamide. 72.4 g of Copolymer 15 was obtained, for a yield of 97.8%.

Example 17

Synthesis of Copolymer 16

Copolymer 16, a copolymer of 37.0 mol-% N-phenylmaleimide/19 mol-% methacrylamide/15 mol-% methacrylic acid/29 mol-% PLEX 6852-0, was synthesized according to the method outlined in Example 14. The components used in step 2 were PLEX 6852-0 (57.42 g), methacrylic acid (6.46 g), N-phenylmaleimide (32.04 g), methacrylamide (8.09 g) and 226 g of dimethylacetamide. A yield of 98.2% was obtained.

Table 1 summarizes the monomer content of Copolymers 1–16 described above.

TABLE 1

| Copolymer # | Monomer content of Copolymers 1–16 (stated as mol-% of reactant monomers). PLEX 6852-O | N-Phenyl maleimide | Methacrylamide | N-methoxy-methyl methacrylamide | Methacrylic acid | Acrylonitrile |
|---|---|---|---|---|---|---|
| 1, 2 | 15 | 30 | 30 | | 25 | |
| 3 | 20 | 30 | 30 | | 20 | |
| 4 | 20 | 35 | 30 | | 15 | |
| 5 | 25 | 30 | 30 | | 15 | |
| 6 | 20 | 40 | 25 | | 15 | |
| 7 | 15 | 30 | | 30 | 25 | |
| 8 | 20 | 30 | | 30 | 20 | |

TABLE 1-continued

Monomer content of Copolymers 1–16 (stated as mol-% of reactant monomers).

| Copolymer # | PLEX 6852-O | N-Phenyl maleimide | Methacrylamide | N-methoxy-methyl methacrylamide | Methacrylic acid | Acrylonitrile |
|---|---|---|---|---|---|---|
| 9 | 25 | 30 | | | 20 | 25 |
| 10 | 25 | 40 | | | 20 | 15 |
| C11 | 25 | 50 | 5 | | 20 | |
| 12 | 20 | 45 | 15 | | 20 | |
| 13 | 25 | 35 | 17 | | 23 | |
| 14 | 25 | 35 | | 20 | 20 | |
| 15 | 26 | 35 | 17 | | 22 | |
| 16 | 29 | 37 | 19 | | 15 | |

Examples 18 to 23

Preparation and Testing of Imageable Elements for Use with Solvent-based Developer Coating compositions were prepared according to the formulations given in Table 2 below, using a solvent of 65/15/10/10 (w:w:w:w) dioxolane/propylene glycol monomethyl ether/butyrolactone/water. Quantities given in Table 2 are expressed as weight-percents based on solids only. Each coating composition was coated onto a Substrate A using a wire-wound bar, and dried at 135° C. for 30 seconds. The coating weight of the resulting layer was 1.5 $gm^{-2}$.

TABLE 2

Coating formulations for Examples 18–23.

| Example # | Copolymer # 1 | 3 | 4 | 5 | 6 | 7 | IR Dye A | BYK 307 | D11 DYE |
|---|---|---|---|---|---|---|---|---|---|
| 18 | 83.0 | | | | | | 15.0 | 0.5 | 1.5 |
| 19 | | 83.0 | | | | | 15.0 | 0.5 | 1.5 |
| 20 | | | 83.0 | | | | 15.0 | 0.5 | 1.5 |
| 21 | | | | 83.0 | | | 15.0 | 0.5 | 1.5 |
| 22 | | | | | 83.0 | | 15.0 | 0.5 | 1.5 |
| 23 | | | | | | 83.0 | 15.0 | 0.5 | 1.5 |

Samples of each coated substrate, and for the basecoat of a SWORD EXCEL Thermal Printing Plate, were subjected to the following qualitative tests:

Developer solubility—Drops of 956 Developer were applied to the coating at two-second intervals up to 30 seconds, then washed off immediately with water. The time taken to fully dissolve the coating was recorded, and is reported in Table 3.

Resistance to UV wash—Drops of 4:1 (v:v) diacetone alcohol/water were placed on each coating at one-minute intervals up to 5 minutes, then washed off with water. An estimation of the amount of coating remaining after 5 minutes was made, and is reported in Table 3.

Resistance to alcohol-sub fount—Drops of 4:1 (v:v) butyl CELLOSOLVE/water were placed on each coating at one-minute intervals up to 5 minutes, then washed off with water. An estimation of the amount of coating remaining after 5 minutes was made, and is reported in Table 3.

TABLE 3

Results for qualitative tests for coated substrates of Examples 18–23.

| Example | Developer Solubility (sec) | UV Wash Resistance (% coating remaining) | Alcohol-sub Fount Resistance (% coating remaining) |
|---|---|---|---|
| 18 (Cop. 1) | 2 | 60 | 70 |
| 19 (Cop. 3) | 2 | 80 | 95 |
| 20 (Cop. 4) | 12 | — | 80 |
| 21 (Cop. 5) | 8 | 50 | 80 |
| 22 (Cop. 6) | 20 | 80 | 80 |
| 23 (Cop. 7) | 2 | — | 50 |
| SWORD EXCEL Basecoat | 6 | 40 | 30 |

A formulation for a top layer comprising the components described in Table 4 in diethyl ketone was prepared. The formulation concentration was selected to provide a dry film having a coating weight of 0.7 $gm^{-2}$. The formulation was applied to the coated substrates described above by means of a wire-wound bar, and dried at 135° C. for 30 seconds to produce a two-layered imageable element.

TABLE 4

Formulation for top layer for two-layered imageable elements of Examples 18–23.

| Component | Parts by Weight |
|---|---|
| PD140A | 69.1 |
| P3000 | 30 |
| Ethyl Violet | 0.4 |
| BYK307 | 0.5 |

The imageable elements produced were subjected to imaging and processing tests as follows: Imageable elements were imagewise exposed with 830 nm radiation on a Creo 3244 TRENDSETTER. Plot 0 internal test pattern was applied at 8 watts with exposure energies of 130, 120, 110, 100, 90, 80 and 70 $mJ/cm^2$. Imaged elements were developed in a Kodak Polychrome Graphics 85N Processor using 956 Developer at 25° C., at a processing speed of 5 feet per minute. Processed plates were evaluated for cleanout (i.e., minimum exposure necessary to produce a clean image) and best exposure (i.e., exposure which produces the best image quality). Results are reported in Table 5.

TABLE 5

Results of imaging and processing tests for two-layered imageable elements of Examples 18 and 20–23.

| Example | Exposure ($mJ/cm^2$) Cleanout | Best Exposure |
|---|---|---|
| 18 (Cop. 1) | 110 | 130 |
| 20 (Cop. 4) | 100 | 130 |
| 21 (Cop. 5) | 80 | 80 |
| 22 (Cop. 6) | 80 | 100 |
| 23 (Cop. 7) | 80 | 80 |
| SWORD EXCEL | 90 | 110 |

Examples C24, 25–26, C27, and 28–30

Preparation and Testing of Imageable Elements for Use with Negative Developer Coating compositions were prepared according to the formulations given in Table 6 below, using a solvent of 65/15/10/10 (w:w:w:w) dioxolane/propylene glycol monomethyl ether/butyrolactone/water. Quantities given in Table 6 are expressed as weight-percents based on solids only. Each coating composition was coated onto a Substrate A using a wire-wound bar, and dried at 135° C. for 30 seconds. The coating weight of the resulting layer was 1.5 $gm^{-2}$. Examples C24 and C27 are comparative examples.

TABLE 6

Coating formulations for Examples C24 and 25–30.

| Example # | Copolymer # ACR 1478 | Copolymer 1 | Copolymer 2 | Copolymer 11 | Copolymer 9 | Copolymer 10 | Copolymer 3 | IR Dye A | BYK 307 | D11 DYE |
|---|---|---|---|---|---|---|---|---|---|---|
| C24 | 83.5 | | | | | | | 15.0 | 0.5 | 1.0 |
| 25 | | 83.5 | | | | | | 15.0 | 0.5 | 1.0 |
| 26 | | | 83.5 | | | | | 15.0 | 0.5 | 1.0 |
| C27 | | | | 83.5 | | | | 15.0 | 0.5 | 1.0 |
| 28 | | | | | 83.5 | | | 15.0 | 0.5 | 1.0 |
| 29 | | | | | | 83.5 | | 15.0 | 0.5 | 1.0 |
| 30 | | | | | | | 83.5 | 15.0 | 0.5 | 1.0 |

Samples of each coated substrate were subjected to the following qualitative tests:

Developer solubility—Drops of 4:1 (v:v) water/ND-1 were applied to the coating at two-second intervals up to 30 seconds, then washed off immediately with water. The time taken to fully dissolve the coating was recorded, and is reported in Table 7.

Resistance to UV wash—Drops of 4:1 (v:v) diacetone alcohol/water were placed on each coating at one-minute intervals up to 10 minutes, then washed off with water. The time taken to fully remove the coating was recorded, and is reported in Table 7.

Resistance to alcohol-sub fount—Drops of 4:1 (v:v) butyl CELLOSOLVE/water were placed on each coating at one-minute intervals up to 10 minutes, then washed off with water. The time taken to fully remove the coating was recorded, and is reported in Table 7.

Baking test—The coated substrate was baked in a Mathis LABDRYER at 230° C. for 8 minutes with a fan speed of 1000 rpm. A positive deletion gel, PE3S (available from Kodak Polychrome Graphics, Japan Ltd.) was applied at two-minute intervals up to 12 minutes, then rinsed with water. The coating was considered to be 100% bakeable if the deletion gel did not remove any of the coating. The coating was considered to be 50% bakeable if the deletion gel removed 50% of the coating. Results are reported in Table 7.

TABLE 7

Results for qualitative tests for coated substrates of Examples C24, 25, 26, C27, and 28–30.

| Example | Time taken for complete coating removal: Developer Solubility (sec) | UV Wash Resistance (min) | Alcohol-sub Fount Resistance (min) | Baking test (% removed after 12 minutes) |
|---|---|---|---|---|
| C24 (ACR 1478) | 6 | 10 | >10 | 100% attack |
| 25 (Cop. 1) | 4 | >10 | >>10 | 40% attack |
| 26 (Cop. 2) | 4 | >10 | >>10 | 40% attack |
| C27 (Cop. 11) | 10 | 10 | >10 | 60% attack |
| 28 (Cop. 9) | 4 | 4 | >10 | 40% attack |
| 29 (Cop. 10) | 4 | 4 | >10 | 50% attack |
| 30 (Cop. 3) | 4 | >10 | >>10 | 20% attack |

A formulation for a top layer comprising the components described in Table 8 in 92:8 (v:v) diethyl ketone/1-methoxypropylacetate was prepared. The formulation concentration was selected to provide a dry film having a coating weight of 0.65 $gm^{-2}$. The formulation was applied to the coated substrates described above by means of a wire-wound bar, and dried at 135° C. for 30 seconds to produce a two-layered imageable element.

TABLE 8

Formulation for top layer for two-layered imageable elements of Examples C24, 25, 26, C27, and 28–30.

| Component | Parts by Weight |
|---|---|
| MMA-3 | 99.1 |
| Ethyl Violet | 0.4 |
| BYK307 | 0.5 |

The imageable elements produced were subjected to qualitative tests and imaging and processing tests as follows:

Developer solubility—Drops of 4:1 (v:v) water/ND-1 were applied to the topcoat at ten-second intervals up to 2 minutes, then washed off with water. The time taken for the developer to start attacking the topcoat was recorded, and is reported in Table 9.

Imaging/processing tests—Imageable elements were imagewise exposed with 830 nm radiation on a Creo 3244 TRENDSETTER. Plot 0 internal test pattern was applied at 8 watts with exposure energies of 134, 125, 117, 110, 104, 99, 94, 89, 85 & 82 mJ/cm$^2$. Imaged elements were developed in a Kodak Polychrome Graphics PK910II processor containing 4.5:1 (v:v) water/ND-1 at 30° C. Development time was 12 seconds. Processed plates were evaluated for cleanout (i.e., minimum exposure necessary to produce a clean image) and best exposure (i.e., exposure which produces the best image quality). Results are reported in Table 9.

TABLE 9

Results of imaging and processing tests for two-layered imageable elements of Examples C24, 25, 26, C27, and 28–30.

| Example | Developer Solubility (sec) | Exposure (mJ/cm$^2$) Cleanout | Best Exposure |
|---|---|---|---|
| C24 (ACR 1478) | 50 | 85 | 110 |
| 25 (Cop. 1) | 30 | 89 | 110 |
| 26 (Cop. 2) | 20 | 85 | 104 |
| C27 (Cop. 11) | 60 | — | — |
| 28 (Cop. 9) | 30 | — | — |
| 29 (Cop. 10) | 30 | 104 | 134 |
| 30 (Cop. 3) | 30 | 85 | 104 |

Examples 31–35 and C36

Preparation and Testing of Imageable Elements for Use with Solvent-based Developer or Aqueous Alkaline Developer Coating compositions were prepared according to the formulations given in Table 10, using a solvent of 65/15/10/10 (w:w:w:w) dioxolane/propylene glycol monomethyl ether/butyrolactone/water. Quantities given in Table 10 are expressed as weight-percents based on solids only. Each coating composition was coated onto a Substrate A using a wire-wound bar, and dried at 135° C. for 30 seconds. The coating weight of the resulting layer was 1.3 gm$^{-2}$.

TABLE 10

Coating formulations for Examples 31–35 and C36.

| Example # | Copolymer # 12 | 13 | 14 | 15 | 16 | ACR 1478 | IR dye A | BYK 307 | D11 Dye |
|---|---|---|---|---|---|---|---|---|---|
| 31 | 83.0 | | | | | | 15.0 | 0.5 | 1.5 |
| 32 | | 83.0 | | | | | 15.0 | 0.5 | 1.5 |
| 33 | | | 83.0 | | | | 15.0 | 0.5 | 1.5 |
| 34 | | | | 83.0 | | | 15.0 | 0.5 | 1.5 |
| 35 | | | | | 83.0 | | 15.0 | 0.5 | 1.5 |
| C36 | | | | | | 83.0 | 15.0 | 0.5 | 1.5 |

Samples of each coated substrate were subjected to the following tests:

Gravimetric soak loss: A pre-weighed disc of the coated substrate was placed in a solvent/water mixture for 5 min. The weight loss was measured and the percent weight loss is recorded in Table 11. A lower number indicates a higher resistance to the solvent tested. The following solvent/water mixtures were tested:

BC/$H_2O$: 80:20 (w:w) Butyl CELLOSOLVE/water mixture;

UV/$H_2O$: 80:20 (w:w) Varn UV Wash/water mixture;

DAA/$H_2O$: 80:20 (w:w) Diacetone alcohol/water mixture.

Baking Level: A strip of the coated substrate (5 cm×20 cm) was placed in an oven at 230° C. for 8 min. Kodak Polychrome Graphics Deletion Fluid 231 was applied at 1-min intervals, and after 8 min the fluid was wiped off from the plate. The reported baking level is a qualitative estimate on a scale of Level 0–10 of the extent of deletion of the coating. Level 10 indicates full bakeability, and level 0 indicates that the coating is not bakeable. Results are reported in Table 11.

TABLE 11

Results of qualitative tests for coated substrates of Examples 31–35 and C36.

| Example # | Gravimetric Soak (percent weight loss) BC/$H_2O$ | UV/$H_2O$ | DAA/$H_2O$ | Baking Level |
|---|---|---|---|---|
| 31 (Cop. 12) | 9 | 15 | 32 | 9 |
| 32 (Cop. 13) | 19 | 21 | 38 | 7 |
| 33 (Cop. 14) | 44 | 83 | 85 | 10 |
| 34 (Cop. 15) | 9 | 16 | 69 | 4 |
| 35 (Cop. 16) | 7 | 9 | 50 | 5 |
| C36 (ACR1478) | 22 | 70 | 30 | 0 |

The following topcoat solutions were prepared and applied on the coated substrates as indicated in Table 12:

Topcoat TN13: a solution of TN13 dissolved in diethyl ketone:DOWANOL PMA (92:8 w:w);

Topcoat SMA 1000: a solution of SMA 1000 dissolved in diethyl ketone:DOWANOL PMA (92:8 w:w).

The topcoat solutions were applied by means of a wire-wound bar, and dried at 135° C. for 30 seconds to produce a two-layered imageable element with a top coat dry film weight of 0.65 g/m$^2$.

The imageable elements produced were subjected to imaging and processing tests as follows: Imageable elements were imagewise exposed with 830 nm radiation on a Creo 3244 TRENDSETTER. Plot 0 internal test pattern was applied at 8 watts with exposure energies of 160, 140, 124, 112, 102, 93 and 86 mJ/cm$^2$. Imaged elements were developed in a Kodak Polychrome Graphics Mercury Processor using 956 Developer or T183-5 Developer at 24° C., at a processing speed of 5 feet per minute. Processed plates were evaluated for cleanout (i.e., minimum exposure necessary to produce a clean image) and best exposure (i.e., exposure which produces the best image quality). Results are reported in Table 12.

TABLE 12

Results of imaging and processing tests for two-layered imageable elements of Examples 31–35 and C36.

| Example | Topcoat | Processing speed (mm/min) | Developer | Exposure ($mJ/cm^2$) Cleanout | Exposure ($mJ/cm^2$) Best Exposure |
|---|---|---|---|---|---|
| 31 (Cop. 12) | SMA1000 | 1200 | 956 | 93 | 102 |
| 32 (Cop. 13) | TN13 | 900 | T183-5 | 93 | 102 |
| 33 (Cop. 14) | TN13 | 900 | 956 | 93 | 102 |
| 34 (Cop. 15) | TN13 | 750 | T183-5 | 93 | 102 |
| 35 (Cop. 16) | SMA1000 | 1200 | 980 | 102 | 112 |
| C36 (ACR1478) | TN13 | 1200 | 956: T183-5 (1:1)* | 93 | 102 |

*Hand development 30 sec.

This invention may take on various modifications and alterations without departing from the spirit and scope thereof. Accordingly, it is to be understood that this invention is not to be limited to the above-described, but it is to be controlled by the limitations set forth in the following claims and any equivalents thereof. It is also to be understood that this invention may be suitably practiced in the absence of any element not specifically disclosed herein.

In describing preferred embodiments of the invention, specific terminology is used for the sake of clarity. The invention, however, is not intended to be limited to the specific terms so selected, and it is to be understood that each term so selected includes all technical equivalents that operate similarly.

The invention claimed is:

1. An imageable element comprising:

a substrate having a hydrophilic surface;

a photothermal conversion material;

an ink-receptive top layer, wherein the top layer is substantially free of the photothermal conversion material, and wherein the top layer is not removable by contact with a developer solution prior to imaging of the element; and an underlayer between the hydrophilic surface and the top layer, the underlayer including a copolymer comprising in polymerized form:

a) about 3 to about 50 mol-% of constitutional units derivable from a monomer having a cyclic urea group, the monomer represented by

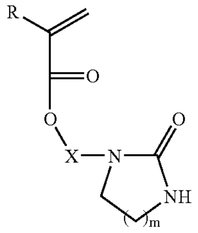

in which R is hydrogen or methyl,

X is ($C_2$–$C_{12}$) alkyl, and m is 1 to 3;

b) about 20 to about 75 mol-% of constitutional units derivable from N-phenyl-maleimide, N-cyclohexylmaleimide, N-benzylmaleimide, N-(p-carboxyphenyl)maleimide, or a combination thereof;

c) about 15 to about 50 mol-% of constitutional units derivable from acrylamide, methacrylamide, N-methoxymethylmethacrylamide, methoxymethylmethacrylate, or a combination thereof; and d) about 5 to about 40 mol-% of constitutional units derivable from acrylic acid, methacrylic acid, vinyl benzoic acid, or a combination thereof; wherein after imaging of the element, exposed areas of the top layer and the underlayer are both removable by contact with the developer solution.

2. The imageable element of claim 1, wherein the copolymer comprises about 20 to about 75 mol-% of constitutional units derivable from N-phenylmaleimide.

3. The imageable element of claim 1, wherein the copolymer comprises about 15 to about 40 mol-% of constitutional units derivable from methacrylamide.

4. The imageable element of claim 1, wherein the copolymer comprises about 15 to about 40 mol-% of constitutional units derivable from N-methoxymethylmethacrylamide.

5. The imageable element of claim 1, wherein the copolymer comprises about 10 to about 30 mol-% of constitutional units derivable from methacrylic acid.

6. The imageable element of claim 1, wherein the copolymer comprises about 10 to about 30 mol-% of constitutional units derivable from the monomer having the cyclic urea group.

7. The imageable element of claim 1, wherein the monomer having a cyclic urea group is represented by

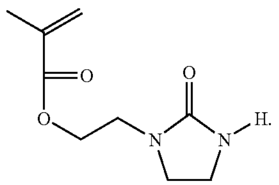

8. The imageable element of claim 7, wherein the copolymer comprises in polymerized form:

a) about 3 to about 50 mol-% of constitutional units derivable from the monomer having the cyclic urea group;

b) about 20 to about 75 mol-% of constitutional units derivable from N-phenylmaleimide;

c) about 15 to about 50 mol-% of constitutional units derivable from methacrylamide, N-methoxymethylmethacrylamide, or a combination thereof; and d) about 5 to about 40 mol-% of constitutional units derivable from methacrylic acid.

9. The imageable element of claim 7, wherein the copolymer comprises in polymerized form:

a) about 10 to about 30 mol-% of constitutional units derivable from the monomer having the cyclic urea group;

b) about 20 to about 50 mol-% of constitutional units derivable from N-phenylmaleimide;

c) about 15 to about 40 mol-% of constitutional units derivable from methacrylamide, N-methoxymethylmethacrylamide, or a combination thereof; and d) about 10 to about 30 mol-% of constitutional units derivable from methacrylic acid.

10. The imageable element of claim 1, wherein the top layer comprises a novolac resin and a dissolution inhibitor.

11. The imageable element of claim 1, wherein the photothermal conversion material is an infrared-absorbing dye.

12. The imageable element of claim 1, wherein the underlayer includes the photothermal conversion material.

13. The imageable element of claim 1, wherein the underlayer comprises about 30 wt.-% to 100 wt.-% of the copolymer, based on the weight of the underlayer.

14. The imageable element of claim 1, further comprising a third layer between the underlayer and top layer, wherein the third layer includes the photothermal conversion material.

15. The imageable element of claim 1, wherein the developer solution is an aqueous alkaline developer.

16. The imageable element of claim 1, wherein the developer solution is a solvent-based developer.

17. A method for use in the production of an imageable element, the method comprising:

providing a substrate having a hydrophilic surface; and coating an underlayer onto the hydrophilic surface, the underlayer including a copolymer comprising in polymerized form:

a) about 3 to about 50 mol-% of constitutional units derivable from a monomer having a cyclic urea group, the monomer represented by

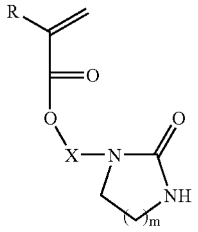

in which R is hydrogen or methyl,

X is ($C_2$ -$C_{12}$) alkyl, and m is 1 to 3;

b) about 20 to about 75 mol-% of constitutional units derivable from N-phenylmaleimide, N-cyclohexylmaleimide, N-benzylmaleimide, N-(p-carboxyphenyl)maleimide, or a combination thereof;

c) about 15 to about 50 mol-% of constitutional units derivable from acrylamide, methacrylamide, N-methoxymethylmethacrylamide, methoxymethylmethacrylate, or a combination thereof; and d) about 5 to about 40 mol-% of constitutional units derivable from acrylic acid, methacrylic acid, vinyl benzoic acid, or a combination thereof; and coating one or more additional layers over the underlayer, to provide an imageable coating.

18. An imageable element comprising:

a substrate having a hydrophilic surface;

a photothermal conversion material;

an ink-receptive top layer, wherein the top layer is substantially free of the photothermal conversion material, and wherein the top layer is not removable by contact with a developer solution prior to imaging of the element; and an underlayer between the hydrophilic surface and the top layer, the underlayer including a copolymer comprising in polymerized form:

a) about 3 about 50 mol-% of constitutional units derivable from a monomer having a cyclic urea group, the monomer represented by

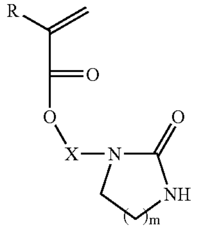

in which R is hydrogen or methyl,

X is ($C_2$ -$C_{12}$) alkyl, and m is 1 to 3;

b) about 5 to about 40 mol-% of constitutional units derivable from acrylic acid, methacrylic acid, vinyl benzoic acid, or a combination thereof; and c) about 5 to about 75 mol-% of constitutional units derivable from acrylonitrile, methacrylonitrile, or a combination thereof;

wherein after imaging of the element, exposed areas of the top layer and the underlayer are both removable by contact with the developer solution.

19. The imageable element of claim 18, wherein the copolymer further comprises about 20 to about 75 mol-% of constitutional units derivable from N-phenyl-maleimide, N-cyclohexylmaleimide, N-benzylmaleimide, N-(p-carboxyphenyl)maleimide, or a combination thereof.

* * * * *